US012772873B2

(12) United States Patent
Morianz et al.

(10) Patent No.: US 12,772,873 B2
(45) Date of Patent: Oct. 20, 2026

(54) COMPONENT CARRIER WITH ELECTRONIC COMPONENTS AND THERMALLY CONDUCTIVE BLOCKS ON BOTH SIDES

(71) Applicant: AT&S Austria Technologie & Systemtechnik AG, Leoben (AT)

(72) Inventors: Mike Morianz, Graz (AT); Johannes Stahr, St. Lorenzen im Mürztal (AT); Simon Pressler, Graz (AT); Maria Prutti, Bruck an der Mur (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 674 days.

(21) Appl. No.: 18/251,875

(22) PCT Filed: Nov. 5, 2021

(86) PCT No.: PCT/EP2021/080749
§ 371 (c)(1),
(2) Date: May 4, 2023

(87) PCT Pub. No.: WO2022/096638
PCT Pub. Date: May 12, 2022

(65) Prior Publication Data

US 2024/0014142 A1 Jan. 11, 2024

(30) Foreign Application Priority Data

Nov. 5, 2020 (EP) .................................... 20205934

(51) Int. Cl.
*H10W 70/60* (2026.01)
*H10W 40/25* (2026.01)
(Continued)

(52) U.S. Cl.
CPC ....... *H10W 70/614* (2026.01); *H10W 40/255* (2026.01); *H10W 70/611* (2026.01);
(Continued)

(58) Field of Classification Search
CPC . H01L 2224/04105; H01L 2224/24137; H01L 2224/29139; H01L 2224/32225;
(Continued)

(56) References Cited

U.S. PATENT DOCUMENTS 5,514,327 A * 5/1996 Schneider ............... B22F 7/062 419/36
5,641,944 A 6/1997 Wieloch et al.
(Continued)

FOREIGN PATENT DOCUMENTS

CN 201397814 2/2010
CN 110896585 A 3/2020
(Continued)

OTHER PUBLICATIONS

Silva, J.C.; Extended European Search Report in Application 20205934.1, pp. 1-8; Apr. 8, 2021; European Patent Office, 80298, Munich, Germany.
(Continued)

*Primary Examiner* — Telly D Green
(74) *Attorney, Agent, or Firm* — Robert A. Blaha; Smith Tempel Blaha LLC

(57) ABSTRACT

A component carrier which includes a stack having at least one electrically conductive layer structure and/or at least one electrically insulating layer structure, a first electronic component and a second electronic component arranged in the stack, a first block and a second block arranged in the stack below the first electronic component and the second electronic component, and a third block and a fourth block arranged in the stack above the first electronic component
(Continued)

and the second electronic component, wherein said blocks are thermally conductive.

27 Claims, 12 Drawing Sheets

(51) Int. Cl.

| | |
|---|---|
| ***H10W 70/05*** | (2026.01) |
| ***H10W 70/63*** | (2026.01) |
| ***H10W 72/30*** | (2026.01) |
| ***H10W 90/00*** | (2026.01) |
| *H10W 70/00* | (2026.01) |
| *H10W 72/00* | (2026.01) |
| *H10W 90/10* | (2026.01) |

(52) U.S. Cl.
CPC ......... *H10W 70/635* (2026.01); *H10W 90/00* (2026.01); *H10W 70/093* (2026.01); *H10W 70/099* (2026.01); *H10W 72/073* (2026.01); *H10W 72/07331* (2026.01); *H10W 72/352* (2026.01); *H10W 72/874* (2026.01); *H10W 90/10* (2026.01); *H10W 90/734* (2026.01)

(58) Field of Classification Search
CPC . H01L 2224/73267; H01L 2224/82106; H01L 2224/8384; H01L 2224/92244; H01L 23/3735; H01L 23/5384; H01L 23/5389; H01L 24/24; H01L 24/29; H01L 24/32; H01L 24/82; H01L 24/83; H01L 24/92; H01L 25/072; H01L 25/50; H01L 2924/10253; H01L 2924/10272; H01L 2924/1033; H01L 2924/13055; H01L 2924/13091; H05K 1/0204; H05K 1/0206; H05K 1/185; H05K 2201/10166; H05K 2201/10416; H05K 2203/061; H05K 2203/1469; H05K 3/429; H05K 3/4652
See application file for complete search history.

(56) References Cited

U.S. PATENT DOCUMENTS

| | | | | |
|---|---|---|---|---|
| 5,654,587 | A * | 8/1997 | Schneider | H01L 21/4882 257/722 |
| 5,693,981 | A * | 12/1997 | Schneider | H01L 23/367 257/722 |
| 5,773,886 | A * | 6/1998 | Rostoker | F28F 3/02 257/796 |
| 5,900,670 | A * | 5/1999 | Schneider | H01L 23/3672 257/722 |
| 6,622,786 | B1 * | 9/2003 | Calmidi | F28F 3/022 165/122 |
| 10,143,092 | B2 | 11/2018 | Mikado et al. | |
| 2008/0041619 | A1 | 2/2008 | Lee et al. | |
| 2011/0044004 | A1 * | 2/2011 | Garosshen | H01L 23/3732 165/185 |
| 2012/0140420 | A1 | 6/2012 | Soyano et al. | |
| 2012/0170225 | A1 | 7/2012 | Liu | |
| 2015/0214127 | A1 * | 7/2015 | Gu | H01L 23/5389 438/118 |
| 2016/0050768 | A1 | 2/2016 | Chen et al. | |
| 2016/0050771 | A1 | 2/2016 | Yu et al. | |
| 2016/0079156 | A1 | 3/2016 | Liu et al. | |
| 2016/0133558 | A1 | 5/2016 | Stahr et al. | |
| 2018/0076111 | A1 * | 3/2018 | Schultz | H01L 21/4882 |
| 2018/0206325 | A1 | 7/2018 | McIntyre et al. | |
| 2019/0198424 | A1 | 6/2019 | Lam et al. | |

FOREIGN PATENT DOCUMENTS

| | | | |
|---|---|---|---|
| CN | 210379025 | U | 4/2020 |
| DE | 1909834 | A1 | 10/1969 |
| DE | 102014103013 | A1 | 9/2015 |
| DE | 102018216593 | A1 | 4/2020 |
| EP | 3364456 | A2 | 8/2018 |
| EP | 3716321 | | 9/2020 |
| WO | 2010078021 | A2 | 7/2010 |
| WO | 2016071324 | A1 | 5/2016 |
| WO | 2018053729 | A1 | 3/2018 |

OTHER PUBLICATIONS

Vanrijssel-Delrio, D.; International Search Report and Written Opinion in Application No. PCT/EP2021/080749; pp. 1-13; Feb. 3, 2022; European Patent Office; P.B. 5818 Patentlaan 2, NL-2280 HV Rijswijk.

* cited by examiner

COMPONENT CARRIER WITH ELECTRONIC COMPONENTS AND THERMALLY CONDUCTIVE BLOCKS ON BOTH SIDES

CROSS-REFERENCE TO RELATED APPLICATIONS

This application is the U.S. national phase of International Application No. PCT/EP2021/080749 filed Nov. 5, 2021, which designated the U.S. and claims priority to European Patent Application No. 20205934.1 filed Nov. 5, 2020, the entire contents of each of which are hereby incorporated herein by reference.

TECHNICAL FIELD

The disclosure relates to methods of manufacturing a component carrier, and to component carriers.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

In particular, efficiently removing heat from an embedded electronic component in a component carrier is an issue.

SUMMARY

There may be a need to efficiently remove heat from an electronic component in a component carrier.

According to an exemplary embodiment of a first aspect of the disclosure, a component carrier is provided, wherein the component carrier comprises at least one electrically conductive layer structure and/or at least one electrically insulating layer structure, a first electronic component and a second electronic component arranged (and in particular laminated) in the stack, a first block and a second block arranged (and in particular laminated) in the stack below the first electronic component and the second electronic component, and a third block and a fourth block arranged (and in particular laminated) in the stack above the first electronic component and the second electronic component, wherein said blocks are thermally conductive (and in particular at least partially electrically conductive).

According to another exemplary embodiment of the first aspect of the disclosure, a method of manufacturing a component carrier is provided, wherein the method comprises providing a stack comprising at least one electrically conductive layer structure and/or at least one electrically insulating layer structure, arranging (in particular by laminating) a first electronic component and a second electronic component in the stack, arranging (in particular by laminating) a first block and a second block in the stack below the first electronic component and the second electronic component, and arranging (in particular by laminating) a third block and a fourth block in the stack above the first electronic component and the second electronic component, wherein said blocks are thermally conductive (and in particular at least partially electrically conductive).

According to an exemplary embodiment of a second aspect of the disclosure, a component carrier is provided which comprises a stack comprising at least one electrically conductive layer structure and/or at least one electrically insulating layer structure, a thermally conductive and/or electrically conductive block arranged in the stack, a vertical hole extending through at least part of the stack and through the entire block, wherein the block has a nail head structure surrounding at least part of the vertical hole and protruding downwardly beyond a planar portion of a lower main surface of the block and protruding upwardly beyond a planar portion of an upper main surface of the block, and a contact structure (in particular an electrically conductive contact structure) in at least part of the vertical hole establishing a connection (in particular an electrically conductive connection) with the block along the nail head section.

According to another exemplary embodiment of the second aspect of the disclosure, a method of manufacturing a component carrier is provided, wherein the method comprises providing a stack comprising at least one electrically conductive layer structure and/or at least one electrically insulating layer structure, arranging a thermally conductive and/or electrically conductive block in the stack, forming a vertical hole extending through at least part of the stack and through the entire block to thereby form a nail head structure of the block around the vertical hole, wherein the nail head structure protrudes downwardly beyond a planar portion of a lower main surface of the block and protrudes upwardly beyond a planar portion of an upper main surface of the block, and forming a contact structure (in particular an electrically conductive contact structure) in at least part of the vertical hole to thereby establish a connection (in particular an electrically conductive connection) with the block along the nail head section.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "electronic component" may particularly denote any component fulfilling an electronic task. For instance such an electronic component may be a semiconductor chip comprising a semiconductor material, in particular as a primary or basic material. The semiconductor material may for instance be a type IV semiconductor such as silicon or germanium, or may be a type III-V semiconductor material such as gallium arsenide. In particular, the semiconductor component may be a semiconductor chip such as a naked die or a molded die.

In the context of the present application, the term "laminating" may particularly denote connecting by the application of heat and/or mechanical pressure. In particular, laminating an electronic component within a stack of layer structures may be accomplished by curing a previously at least partially uncured layer structure (such as a resin or prepreg sheet) triggered by heat and/or mechanical pressure. By heat and/or pressure, the previously at least partially uncured layer structure may become temporarily flowable so as to flow into gaps between the respective electronic component and the layer structures of the stack, may undergo a curing process (in particular by polymerizing, cross-linking, etc.), and may then be resolidified. Hence, lamination may interconnect in particular planar solid layer structures with the respective electronic component by heating and/or applying pressure (rather than by molding).

In the context of the present application, the term "thermally conductive (and preferably at least partially electrically) conductive block" may particularly denote a bulky body (such as a body shaped as a cuboid or cylinder or disc) made of a material having a high thermal conductivity and, preferably but not necessarily, high electrical conductivity. In terms of electrical conductivity, a highly electrically conductive block may have a metallic conductivity, i.e. an electrical conductivity as a metal. For instance, the electrical conductivity of the electrically highly conductive body at 20° C. may be at least $5 \cdot 10^6$ S/m, in particular at least $2 \cdot 10^7$ S/m. In terms of thermal conductivity, the thermal conductivity of the material of a thermally highly conductive block may be at least 35 W/mK, in particular at least 100 W/mK.

In the context of the present application, the term "vertical hole" may particularly denote a recess extending into the component carrier in a direction being substantially perpendicular to a planar main surface of the component carrier or a layer stack thereof.

In the context of the present application, the term "nail head structure" may particularly denote a portion of the block being shaped, in a cross-sectional view of the component carrier, as a horizontally aligned nail head (see for instance FIG. 26). More specifically, such a nail head structure may have, in the cross-sectional view of the component carrier, a tapering portion tapering inwardly from the vertical hole towards a narrower rectangular portion. At the end of the nail head structure with its largest diameter in the cross-sectional view, the nail head structure may have a vertical line. Descriptively speaking, such a nail head structure may be formed by creating the vertical hole extending through the entire block with sufficient energy impact during the hole formation process. Without wishing to be bound to a specific theory, it is presently believed that said energy impact may create a deformation which may be due to the ductile deformation of copper (or other material) to form the nail head structure. In particular, such a nail head structure may be formed mechanically by a rotating drill bit. Alternatively, it is possible to create a nail head structure by a laser beam having a sufficient power and being used for laser drilling the vertical hole. When reaching the (in particular metallic) block, material of the block may be deformed and may then create the nail head structure. Such a nail head structure may be present along only part of or along the entire perimeter of the vertical hole. Depending on the process parameters during drilling, it may be possible that the nail head structure will not extend entirely along the perimeter.

In the context of the present application, the term "electrically conductive contact structure" may particularly denote a member or a material being electrically conductive, being arranged in only part of (for instance only covering sidewalls of) or in the entire vertical hole and being in direct physical contact with the block through which the vertical hole extends so that electric current can be conducted between the electrically conductive contact structure and the block.

According to an exemplary embodiment of the first aspect of the disclosure, a component carrier is provided which has embedded in an interior thereof, in particular completely within stack material, electronic components such as silicon chips, and highly conductive blocks connected to the electronic components. Advantageously, the embedded electronic components and the embedded blocks may be thermally and/or electrically coupled with one another. By taking this measure, it is efficiently possible to conduct electricity and/or heat from the electronic components generated during operation of the component carrier away from an interior of the component carrier (in particular up to a periphery) via highly conductive blocks with low electric resistance and/or low thermal resistance and with short thermal and/or electric path(s). This improves the electric performance and/or the thermal performance and thus the overall reliability of the component carrier since undesired effects such as the generation of thermal stress and consequently undesired phenomena such as warpage may be strongly suppressed. In particular when electrically coupling embedded electronic components and embedded blocks, extremely high electric current (for example of 100 Ampère or more) can be conducted through the bulky blocks without excessive heating of the component carrier. It may also be possible to use the blocks synergistically to remove considerable amount of heat generated by such a high current operation of the component carrier. Highly advantageously, an exemplary embodiment may laminate two electronic components in an interior of a laminated layer stack which results in a simple manufacturing process, a compact design of the component carrier, a proper mechanical protection of the embedded electronic components, and an excellent removal of heat created by the electronic components during operation of the component carrier. Said excellent thermal performance of the component carrier may be promoted by cooling each of the electronic components on each of two respective opposing main surfaces thereof using a pair of thermally conductive and at least partially electrically conductive blocks embedded (preferably also by lamination) above and below each electronic component. Hence, heat removal paths may be established for each electronic component not only in one direction, but simultaneously in two opposing directions up to both exterior main surfaces of the component carrier. By laminating the electronic components in the stack, the space consumption may be kept small. Moreover, this may avoid a further material bridge, as caused by molding. Avoiding said additional material bridge by lamination may further improve the heat removal capability, may suppress the tendency of formation of thermal stress in an interior of the stack and may thereby reduce or even eliminate undesired phenomena such as delamination and warpage. Moreover, the described manufacturing architecture and component carrier design may enable to transport high current with efficient cooling simultaneously. In particular, it may be possible to efficiently carry out embedding of an electronic component in one single lamination stage which may simplify the manufacturing process.

According to an exemplary embodiment of the second aspect of the disclosure (which may or may not be combined with an embodiment according to the first aspect), a component carrier is provided which has a thermally and electrically conductive block embedded in a (preferably laminated) layer stack, wherein said block may be electrically and/or thermally connected to an electrically conductive contact structure in a vertical hole extending also through the entire block. Highly advantageously, the block may have a nail head structure in an interface region with the electrically conductive contact structure which locally increases the connection area. Thus, such a nail head structure may increase the contact area between block and contact structure by locally widening the block both upwardly and downwardly adjacent to the vertical hole. Such a nail head structure can be created by a sufficiently high energy impact during formation of the through hole extending through the entire block, in particular by mechanically drilling with high rotation speed or laser drilling with a high energetic laser beam. Without wishing to be bound to a specific theory, it is presently believed that such an energy impact results in a deformation which may be due to the ductile deformation of (in particular metallic) block material, which creates the nail head structure. By carrying out the mechanical drilling or laser drilling (or other kind of vertical hole formation) process with sufficient energy impact into surrounding metallic block material, formation of the nail head structure becomes possible which advantageously increases the contact area between block and contact structure. Consequently, an improved thermal and electric coupling may be obtained.

In the following, further exemplary embodiments of the manufacturing methods, and the component carriers will be explained.

The blocks may be embedded, for instance by lamination, into the stack. However, it is also possible to in-situ manufacture the copper blocks during the processing. Instead of embedding copper blocks, a thick copper foil can be applied (also by lamination), and recesses between the blocks can be etched away.

In particular, the first electronic component and the second electronic component may be located at the same vertical level, and in particular on and/or in the same layer structure(s) of the stack. It may also be possible that the first block and the second block are located at the same vertical level, and in particular on and/or in the same layer structure(s) of the stack. Additionally or alternatively, it may be possible that the third block and the fourth block are located at the same vertical level, and in particular on and/or in the same layer structure(s) of the stack. The first electronic component may be thermally and/or electrically coupled with the first block and the third block. The second electronic component may be thermally and/or electrically coupled with the second block and the fourth block. The first electronic component and the second electronic component may be electrically coupled.

In an embodiment, each of said blocks is electrically and/or thermally coupled with at least one of the first electronic component and the second electronic component. In particular, in addition to their heat removal function, the blocks may also contribute to a current flow. This may keep the overall ohmic resistance and thus losses small. Furthermore, the double function of the blocks in terms of heat removal and electric signal transport may enable the manufacture of a compact module-type component carrier.

In an embodiment, each of the first electronic component and the second electronic component is a semiconductor chip, in particular at least one of a semiconductor power chip and a transistor chip. Such a semiconductor chip may be embodied for instance in silicon, silicon carbide or gallium nitride technology. When embodied as a transistor chip, the respective electronic component may be for example a field effect transistor chip (in particular a metal oxide semiconductor field effect transistor, MOSFET, chip) or a bipolar transistor chip (in particular an insulated gate bipolar transistor, IGBT, chip). In view of the short current paths and the efficient heat removal by the thermally conductive blocks on both sides of each embedded electronic component, the component carrier is highly appropriate for power semiconductor applications.

In an embodiment, the stack comprises only laminated layer structures. In particular, the stack may be free of mold compound. By interconnecting all constituents of the stack by lamination rather than by molding, the introduction of an additional material type (in particular a mold compound) into the component carrier may be avoided, which keeps the thermal stress in the event of temperature changes small.

In an embodiment, at least one of said blocks comprises one of the group consisting of a metal block, in particular a copper block, a ceramic block (such as an aluminum nitride block) covered with an electrically conductive layer on at least one of two opposing main surfaces thereof, and a ceramic block (in particular a pure ceramic block, i.e. without metal coating). In one embodiment, a block may be a copper block. Highly advantageously, copper has a high thermal and electric conductivity. Moreover, implementing copper in a component carrier such as a printed circuit board (PCB) does not involve an additional material, which has advantages in terms of keeping CTE (coefficient of thermal expansion) mismatch small. Alternatively, it is possible to embody a block as ceramic block, for instance made of aluminum nitride. Such a ceramic material has a high thermal conductivity and can be rendered electrically conductive (so as to contribute also to the conductance of electricity within the component carrier) by partially or entirely cladding the ceramic block with a metal such as copper. For instance, both a top surface and a bottom surface of the ceramic block may be only partially covered with a copper layer.

In an embodiment, the component carrier comprises a first core on and/or within which the first electronic component and the second electronic component are implemented or arranged (in particular mounted), a second core on and/or within which the first block and the second block are implemented or arranged (in particular mounted), and a third core on and/or within which the third block and the fourth block are implemented or arranged (in particular mounted). Thus, the component carrier may be formed by interconnecting three pre-formed cores, wherein two exterior cores may have embedded therein thermally conductive and at least partially electrically conductive blocks, whereas a central core has electronic components (such as metal oxide semiconductor field effect transistor chips, MOSFETs) mounted thereon and/or therein, for instance by (preferably silver) sintering. A core may denote a thick and fully cured electrically insulating layer structure. Advantageously, the use of three cores for accommodating the components and the blocks may allow to implement separate technologies for handling the thermally conductive and at least partially electrically conductive blocks (such as copper blocks handled in PCB technology) on the one hand, and the assembly of the electronic components (for instance sinter connecting MOSFETs) on the other hand. Is also possible that the copper blocks are manufactured in-situ or as self-made copper blocks.

In an embodiment, the first electronic component and the second electronic component operate with a vertical current flow between opposing main surfaces thereof. In particular, each of the electronic components may be embodied as semiconductor chip with vertical current flow. For example, an electronic component embodied as field-effect transistor chip may have a source pad and a gate pad on one main surface and a drain pad on the opposing other main surface. During operation, the electric current may then flow through the semiconductor body between the pads on the two opposing main surfaces. Advantageously, the implementation of electronic components with vertical current flow may keep the component carrier compact and may reduce the parasitic capacitance.

In an embodiment, the component carrier comprises a continuous electrically conductive path which includes the at least one electrically conductive layer structure, said blocks, the first electronic component and the second electronic component. In particular, said blocks may advantageously contribute to an electric function of the component carrier in addition to their thermal heat removal capability.

In an embodiment, the component carrier comprises at least one vertical hole (such as a mechanical or laser drill hole) extending through at least part of the stack and extending entirely through at least one of said blocks, wherein the at least one vertical hole is filled with an electrically conductive structure. Preferably, such a vertical hole may be formed by mechanically drilling through the entire block and through part of the stack. It is also possible to form parts of or even the entire hole by etching. After formation of the vertical hole, which may be a through hole or a blind hole, the vertical hole may be filled partially or entirely with an electrically conductive material such as copper. For example, only sidewalls of the vertical hole may be coated or lined with electrically conductive material, whereas a central part of the vertical hole may remain hollow. Alternatively, the entire volume of the vertical hole may be filled with an electrically conductive material. For example, filling the vertical hole partially or entirely may be accomplished by electroless plating, optionally followed by galvanic plating.

As described in the preceding paragraph, the contact structure may comprise a plated metal structure. However, it is also possible that the contact structure is embodied as a separate member such as a metal pin which may be inserted or pressed into the vertical hole. After formation of the vertical hole, a pre-formed metallic pin may thus be inserted into the vertical hole to thereby form or establish an electrically and thermally conductive connection with the block traversed or penetrated by the vertical hole.

In an embodiment, the above mentioned continuous electrically conductive path may also include the electrically conductive structure in said vertical hole. In particular a nail head structure which may be formed at an interface between the metal-filled vertical hole and the metallic block traversed entirely by the vertical hole may ensure a low ohmic connection with high contact area.

In an embodiment, the component carrier comprises at least one vertical hole extending through at least part of the stack and connecting, in particular electrically connecting, at least two of said blocks, in particular embodied as copper blocks, with each other. This may allow to establish short electric paths (for keeping losses small) and/or thermal paths (for efficiently removing heat).

In an embodiment, a current path being configured for high power applications, in particular for an electric voltage transport of at least 20 kV, is established through the first electronic component and the second electronic component. Hence, an electronic device with high electric performance may be obtained.

In an embodiment, at least one of the first block, the second block, and at least one power current wiring structure of the at least one electrically conductive layer structure is electrically coupled with at least one of the first electronic component and the second electronic component and is configured as at least part of a power bus with high current carrying capacity. Hence, the component carrier may conduct a high current of for example 10 Ampere or more, as required for instance for automotive or locomotive applications. Advantageously, an electrically conductive layer may be made of one or multiple stacked thick copper layers and/or blocks for transmitting high current to the embedded electronic components and may thus build an internal or embedded power bus. Each of the first block, the second block, and the at least one power current wiring structure may also be embodied as a stack of multiple metallic sheets (for instance copper foils) and/or may be embodied by a plurality of separate current paths, which may be produced for example by patterning.

In an embodiment, the at least one of the first block, the second block, and the at least one power current wiring structure has a metallic thickness beneath the at least one of the first electronic component and the second electronic component of at least 300 μm, in particular in a range from 300 μm and 1 mm, preferably for automotive applications. For locomotives applications, the thickness may be larger than 1 mm. In particular, a metallic (preferably copper) thickness arranged below the respective electronic component and configured for supplying the electronic component with electric power may be significantly thicker than ordinary copper foils of a component carrier. With the mentioned high thicknesses, power supply requirements even for demanding automotive and even locomotive applications may be satisfied.

In an embodiment, said power bus is configured with high current carrying capacity of at least 10 Ampère, in particular at least 50 Ampère, preferably at least up to 500 Ampère. Such current values are typical for automotive (for example even up to 750 Ampère or more) and locomotive applications (for example even up to 1000 Ampère or more). The highly sophisticated thermal performance of a component carrier according to an exemplary agreement of the disclosure may be of particular advantage for such high-power applications.

In an embodiment, the component carrier comprises a sinter-type connection medium in an interior of the stack, in particular for connecting at least one of the first electronic component and the second electronic component. Advantageously, an embedded sinter depot for connecting the embedded electronic components may be implemented inside of the stack. This may ensure a proper integrity inside of the component carrier and a low ohmic and thermally efficient connection of an embedded electronic component in an interior of the stack. Surprisingly, sinter connections in an interior of a stack with embedded components have turned out to be perfectly compatible with PCB manufacturing technology.

In an embodiment, the component carrier comprises at least one side cavity formed in at least one lateral end section of the stack. Such a side cavity may form a step at a respective side wall of the stack. Highly advantageously, such sides cavities of a PCB stack offer a proper mechanical and electrical interface in particular for power connectors.

Preferably, the component carrier comprises a plurality of side cavities formed in opposing lateral end sections of the stack. This ensures a sufficient spacing between different power terminals and thus a proper electric decoupling in between. Advantageously, this may reliably prevent spark-over or arcing.

In an embodiment, a power current wiring structure of the at least one electrically conductive layer structure and/or at least one electrically conductive connection block is exposed or arranged in the at least one side cavity and forms at least part of a power bus with high current carrying capacity. Advantageously, the component carrier may comprise at least one power connector (such as a power pin) being directly electrically connected with the power current wiring structure and/or the at least one electrically conductive connection block exposed in the at least one side cavity, in particular for establishing a power connection of the component carrier with an exterior high current power supply. Thus, a thick electrically conductive layer structure and/or an additional copper block may be exposed in the side cavity and may allow a simple connection of one or more power connectors for supplying power to the component carrier. Signal terminals for transmitting electric signals may be provided elsewhere at the component carrier.

Hence, a preferred embodiment of the disclosure may comprise one or more side cavities on at least one side of the module-type component carrier. In this or these cavities, an external power bus may be attached directly to an internal power bus (such as a thick copper layer, as described above). This may allow to establish a low-inductive coupling and thus a transmission of very high current up to 750 Ampère (preferred up to 500 Ampere). The connection can be done advantageously by welding, or by another connection technique. In order to prevent a negative influence on the other signals of the board, a certain distance from the external power bus to the lateral conductive layers may be advantageous.

In an embodiment, the component carrier comprises at least one further thermally conductive block below the first block and below the second block for conducting heat from the first electronic component and/or the second electronic component via the at least one further thermally conductive block towards a cooling unit (such as a heat sink with cooling fins). This may further improve the thermal performance of the module-type component carrier.

In an embodiment, the at least one further thermally conductive block comprises a first further thermally conductive block below and thermally connected with the first block and comprises a second further thermally conductive block below and thermally connected with the second block. Hence, a separate additional thermally conductive block (for instance made of ceramic or copper) may be provided for each individual first and second block for properly adjusting a heat removal path from the assigned embedded electronic component.

In an embodiment, the component carrier comprises a continuous thermally conductive and electrically insulating structure arranged below the first block and below the second block and extending over the entire width of the stack. Such a continuous thermally conductive and dielectric layer may extend over an entire horizontal plane inside of the stack and may be free of electrically conductive elements. This may ensure a proper decoupling of a bottom side of the component carrier from electricity and may nevertheless guarantee proper heat removal.

In an embodiment, the continuous thermally conductive and electrically insulating structure comprises or consists of a homogeneous thermally conductive and electrically insulating layer, in particular a layer of thermal prepreg. Thus, the continuous layer may be dielectric and thermally conductive and may be sandwiched between the upper electrically conductive structures of the stack and the external cooling unit below.

In another embodiment, the continuous thermally conductive and electrically insulating structure comprises a homogeneous thermally conductive and electrically insulating layer structure, in particular a layer structure of thermal prepreg, in which at least one further thermally conductive block, in particular a ceramic inlay, is embedded, the latter boosting the thermally conductive function. Preferably, the at least one further thermally conductive block comprises a first thermally conductive block below the first block and comprises a second thermally conductive block below the second block. Hence, the mentioned continuous layer may be made partially by ceramics (for example aluminum nitride or silicon nitride) between the electrically conductive portion of the stack and an external cooling unit. Thus, one or more ceramic inlays may be provided below the stack-internal power bus, which is or are surrounded by thermally conductive prepreg.

In an embodiment, the first thermally conductive block has a smaller lateral extension than the first block and/or the second thermally conductive block has a smaller lateral extension than the second block. Preferably, the ceramic inlays have a smaller dimension than the copper blocks of the power bus. This may reduce the manufacturing effort because expensive ceramic material is provided only where absolutely needed. At the same time, such selectively arranged ceramic blocks surrounded by thermal prepreg have turned out to be sufficient for providing excellent cooling performance.

In an embodiment, the at least one electrically conductive layer structure comprises at least one power current wiring structure for supplying electric power to at least one power terminal (for instance a source terminal and/or a drain terminal, when the respective electronic component is embodied as field effect transistor chip) of at least one of the first electronic component and the second electronic component. Moreover, the at least one electrically conductive layer structure may comprise at least one control wiring structure for supplying a control signal to at least one control terminal (for instance a gate terminal, when the respective electronic component is embodied as field effect transistor chip) of at least one of the first electronic component and the second electronic component. Advantageously, the at least one power current wiring structure may be provided along a spatially separate electric path compared with the at least one control wiring structure. This allows to separately supply control signals and power signals to the respective one of the first component and the second component.

In an embodiment, the at least one control wiring structure is provided in common for both the first electronic component and the second electronic component. This simplifies the circuitry and renders the component carrier contact. The number of control wiring structures and the number of control signals may thus be reduced.

In an embodiment, the common at least one control wiring structure is configured for supplying a control signal to the control terminals of the first electronic component and the second electronic component with identical or at least substantially identical control signal path lengths. This avoids artefacts (for instance switching delay) by components being controlled with the same control signal at different points of time due to control signal wiring with significantly different lengths.

In an embodiment, the first electronic component is mounted on the first block and the second electronic component is mounted on the second block by a connection medium. In particular, the connection medium may comprise one of the group consisting of a sinter structure, a solder structure, and an adhesive. By such a connection medium, a low ohmic and thermally highly conductive coupling between electronic component and assigned bottom-sided block may be established. A silver sinter medium or a diffusion bonding medium may be preferred. It may also be possible to establish the connection by thermal compression bonding.

In an embodiment, the blocks are configured for conducting electricity between the first electronic component and the second electronic component and are configured for removing heat out of the component carrier. Since the blocks may be configured and interconnected for fulfilling a thermal and electric double function, a compact component carrier may be created with high electrical and thermal performance.

In an embodiment, in a cross-sectional view of the component carrier, the above-mentioned current path is established which has a horizontal section, a subsequent vertical section extending through the first electronic component, a subsequent horizontal section, a subsequent vertical section extending between the first electronic component and the second electronic component, a subsequent horizontal section, a subsequent vertical section extending through the second electronic component, and a subsequent horizontal section. By the described current trajectory with vertical paths extending through the respective electronic components and one or more metal-filled vertical holes, and horizontal paths extending along the electrically conductive layer structures and/or the at least partially electrically conductive blocks, it is possible to significantly reduce the parasitic capacitance, which may reduce losses and signal distortions.

In an embodiment, the first electronic component and the second electronic component are configured and are interconnected by the blocks and the at least one electrically conductive layer structure to provide a half-bridge function. A half-bridge may be a current converter using switches to control an output voltage. For instance, a half-bridge may be implemented in a motor control.

In an embodiment, the stack comprises a plurality of electrically insulating layer structures, wherein at least one electrically insulating layer structure (in particular an uppermost and/or a lowermost electrically insulating layer structure) of the stack has a higher thermal conductivity compared to at least one remaining electrically insulating layer structure of the stack. The one or more electrically insulating layer structure(s) having a higher thermal conductivity than the other(s) may be for example a thermal prepreg which may have, for example, a thermal conductivity of at least 1.0 W/mK, in particular of at least 1.8 W/mK, and preferably of at least 2 W/mK. Consequently, such a thermal prepreg may provide a pronounced contribution to the heat removal and may therefore be most effective at an exterior position of the stack. The one or more remaining electrically insulating layer structures may for instance be made of ordinary prepreg and may have, for example, a thermal conductivity of 0.3 W/mK to 0.8 W/mK.

In an embodiment, the nail head structure protrudes upwardly and/or downwardly beyond the respective planar portion by a value in a range from 5 μm to 70 μm, in particular by a value in a range from 50 μm to 70 μm. With such dimensions of the upper and/or lower extension of the nail head structure beyond the planar portion of the block, an increase of a contact area between electrically conductive contact structure and nail head structure may be so pronounced that a high mechanical and electrical reliability may be obtained in this interface region.

In an embodiment referring to the formation of a nail head structure, the block may comprise or consists of a metal, in particular copper. Copper has turned out as particularly appropriate for creating a nail head structure with pronounced extension at the upper and at the lower side when impacted preferably by a mechanical drill bit (or alternatively by a laser beam) introducing thermal energy in the block during drilling. Alternatively, the block used for the formation of a nail head structure comprises a metal coated ceramic.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g. fibers impregnated with the above-mentioned resins is called prepreg. These prepregs are often named after their properties e.g. FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the disclosure are apparent from the examples of embodiment to be described hereinafter and are explained with reference to these examples of embodiment.

DETAILED DESCRIPTION OF ILLUSTRATED EMBODIMENTS

Figure 1:
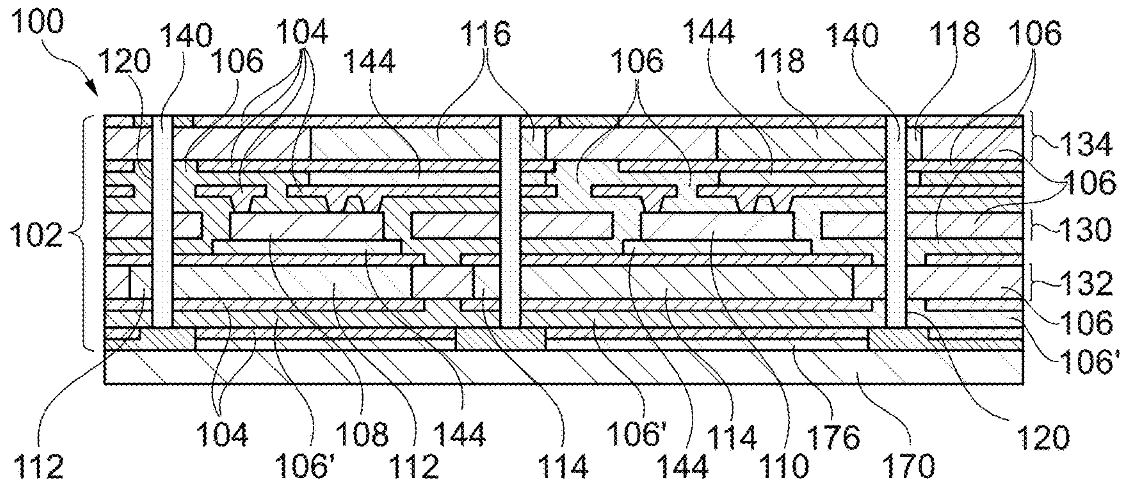
FIG. 1 illustrates a cross-sectional view of a component carrier according to an exemplary embodiment of the disclosure.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the disclosure have been developed.

According to an exemplary embodiment of the disclosure, a component carrier is provided which has at least two electronic components (such as semiconductor chips) creating a significant amount of heat during operation. These electronic components may be embedded in a layer stack by lamination. For heat removal, each of the electronic components may be provided with an assigned pair of thermally conductive and at least partly electrically conductive blocks (for instance copper blocks) being embedded in the stack as well and being arranged above and below each respective electronic component. This may combine a compact design, a simple manufacturing process, a high thermal performance and a proper mechanical and electrically reliability of the obtained component carrier. In particular, an exemplary embodiment relates to a chip-on-block arrangement integrated in a component carrier and having an additional block assigned to the same chip on the top side. Such an embodiment may overcome conventional limitations in terms of current carrying capability in a horizontal plane of a component carrier caused by limited copper layer thickness (of conventionally 70 μm at the maximum). Conventionally, higher current values require multiple power layers which increases the space consumption. In contrast to such conventional approaches, exemplary embodiments of the disclosure may enable to transport higher current in particular along one or more vertically extending holes connected to blocks (such as metal inlays) which may extend predominantly in a horizontal plane.

In such an architecture, a gate connection of a transistor chip-type electronic component can be realized with thin copper technology. This is properly compatible with a small pad size and a spacing between gate and source. A component carrier according to an exemplary embodiment of the disclosure may be manufactured based on cores with embedded copper blocks which can be prefabricated, thereby simplifying the manufacturing process. In particular, it may be possible to use sintered and/or diffusion soldered interconnections to establish full area metal interconnection in particular on a drain side of a transistor chip-type electronic component. The use of sintered cores with embedded copper blocks may also enable to transport heat in a horizontal plane and in a vertical direction of the component carrier. For example, an electrically conductive contact between gate and source of transistor chip-type electronic components may be accomplished by microvias. Laminating the electronic components in the stack may allow to embed or encapsulate electronic components (in particular embodied as MOSFET chips) with printed circuit board (PCB) material. This may avoid the addition of other materials such as a mold compound. In particular, it may be advantageous to use vertical through holes and metal inlays to transmit current through the module-type component carrier. Thus, the blocks may have a double function of removing heat (by increasing thermal conductivity) and conducting current.

Advantageously, a component carrier according to an exemplary embodiment of the disclosure may allow simultaneously to transport a high current and to provide an efficient cooling. It may be possible to embed electronic components with silver backside metallization so that a pad-metallization on the backside of an electronic component may be dispensable. Furthermore, it may be possible to connect a gate pad of an electronic component with thin copper lines, whereas source and drain pad may be connected with thick lines (which may be formed by a copper block and copper wires) to transfer high current and heat. Furthermore, the manufacturing architecture may be significantly simplified by embedding the electronic components by lamination, preferably in a single lamination process. Exemplary embodiments may be highly appropriate for high power applications, for instance using wide band gap semiconductors such as SiC or GaN. For power electronics applications, the cooling concept with thermally conductive blocks on both opposing main surfaces of each electronic component of the component carrier may make it possible to transport high current in parallel. Hence, exemplary embodiments of the disclosure may transport a high current in a PCB-type component carrier with embedded power components (or with an embedded system of electronic components inside) and by removing generated heat out of it in parallel.

In one embodiment of the disclosure, power components may be placed onto a manufactured core with integrated cooling block (which may for instance be made of a metal such as copper and/or a ceramic such as aluminum nitride) and may be embedded in one single process by lamination and sintering. A corresponding power component may be placed with the bottom side of the device onto a sinter depot printed in advance on the core with the cooling block. This may render the manufacturing process simple and may in particular avoid the lamination and subsequent removal of a carrier tape during manufacturing. In a further lamination stage, a core with a cooling block may be applied on top.

According to another exemplary embodiment of the disclosure, a component carrier with embedded thermally and electrically conductive block is provided in which a vertical hole is formed. The latter may be filled at least partially with an electrically conductive contact structure, such as a copper pin or a plating structure. Highly advantageously, the block may be provided with a nail head structure in a contact region to the contact structure, which increases their mutual contact area and thereby reduces the thermal and electrical contact resistance. The nail head structure of the block may extend up to the vertical hole, i.e. may partially delimit the vertical hole along its entire perimeter. Advantageously, such a nail head structure may be formed by an energy impact during formation of the through hole extending through the entire block, in particular by mechanically drilling using a rapidly rotating drill bit or laser drilling by a pulsed or continuous highly energetic laser beam.

FIG. 1 illustrates a cross-sectional view of a component carrier 100 according to an exemplary embodiment of the disclosure.

As shown, component carrier 100 comprises a laminated layer stack 102 composed of a plurality of electrically conductive layer structures 104 and a plurality of electrically insulating layer structures 106. Lamination may particularly denote the connection of the layer structures 104, 106 by the application of pressure and/or heat. For example, the electrically conductive layer structure(s) 104 may comprise patterned or continuous copper foils (as shown) and vertical through-connections, for example copper filled laser vias which may be created by plating. The electrically insulating layer structure(s) 106 may comprise a respective resin (such as a respective epoxy resin), preferably comprising reinforcing particles therein (for instance glass fibers or glass spheres). For instance, the electrically insulating layer structures 106 may be made of prepreg or FR4. In the shown embodiment, the entire stack 102 is made of laminated layer structures 104, 106 only and is free of mold compound. Hence, the material of the laminated layer stack 102 is substantially homogeneous and does not involve a pronounced CTE mismatch. This keeps thermal tensions and stress in an interior of the stack 102 small.

A first electronic component 108 and a second electronic component 110 are embedded in a central portion of the stack 102 by lamination and are located at the same vertical level. Each of the electronic components 108, 110 may be embodied as a power semiconductor transistor chip (more specifically a MOSFET) with vertical current flow. For instance, the first electronic component 108 and the second electronic component 110 may be configured and may be interconnected by copper blocks 112, 114, 116, 118 and the electrically conductive layer structures 104 to provide a half-bridge function. The electronic components 108, 110 may create a significant amount of heat during operation of the component carrier 100.

As shown, a thermally conductive and electrically conductive first block 112 and a thermally conductive and electrically conductive second block 114 are also embedded in the stack 102 at the same vertical level by lamination and are both arranged below the first electronic component 108 and the second electronic component 110. More specifically, first block 112 is located below and is electrically and thermally connected with the first component 108. As shown, the first block 112 extends over the entire lateral extension of the first component 108 and extends even beyond the lateral edges of the first component 108. Correspondingly, second block 114 is located below and is electrically and thermally connected with the second component 110. Furthermore, the second block 114 extends over the entire lateral extension of the second component 110 and extends even beyond lateral edges of the second component 110. The stacked arrangement of the first block 112 and the first component 108 is arranged side-by-side to the stacked arrangement of the second block 114 and the second component 110. In the shown embodiment, blocks 112, 114 may be copper blocks.

Furthermore, a third block 116 and a fourth block 118 are embedded in the stack 102 by lamination, are located at the same vertical level, and are arranged above the first electronic component 108 and the second electronic component 110. More specifically, third block 116 is located above and is electrically and thermally connected with the first component 108. As shown, the third block 116 laterally overlaps with the first component 108. Correspondingly, fourth block 118 is located above and is electrically and thermally connected with the second component 110. Furthermore, the fourth block 118 laterally overlaps with the second component 110. In the shown embodiment, blocks 116, 118 may be copper blocks.

As an alternative to such metallic inlays, it is also possible to implement ceramic inlays (which may be cladded by metal) as one or more of the blocks 112, 114, 116, 118 to transport current and/or heat. For instance, DCB (Direct Copper Bonding) substrates or pieces may also be used as blocks 112, 114, 116, 118.

More specifically, the stack 102 of the component carrier 100 is composed of a first core 130 in which the first electronic component 108 and the second electronic component 110 are mounted, a second core 132 in which the first block 112 and the second block 114 are mounted, and a third core 134 in which the third block 116 and the fourth block 118 are mounted. Each respective core 130, 132, 134 may comprise a thick central electrically insulating layer structure 106 which may be made of fully cured FR4 material, and which may or may not be optionally covered on each of the two opposing main surfaces thereof with a respective electrically conductive layer structure 104, such as a patterned copper foil.

Similar as in FIG. 24 and FIG. 25, a continuous electrically conductive path (see reference sign 136 in FIG. 24 and FIG. 25) may be formed by the electrically conductive layer structures 104, the blocks 112, 114, 116, 118, the first electronic component 108 and the second electronic component 110 as well as by electrically conductive structures 140 in vertical holes 120 described below. Thus, blocks 112, 114, 116, 118 may fulfil a double function. On the one hand, they may contribute to the conductance of electricity through the electronic components 108, 110 in an interior of the component carrier 100. At the same time, they may remove heat created by the electronic components 108, 110 during operation of the component carrier 100 both towards an upper main surface and a lower main surface according to FIG. 1. This may ensure an efficient double-sided cooling rendering component carrier 100 particularly appropriate for high-power applications.

As shown in FIG. 1 as well, component carrier 100 has several vertical holes 120 extending from an upper main surface of the component carrier 100 through an upper part of the stack 102 and through one or two of the blocks 112, 114, 116, 118. More specifically, one of the vertical holes 120 extends only through first block 112 as well as through portions of the stack 102 above and below the first block 112. Another one of the vertical holes 120 extends only through fourth block 118 as well as through portions of the stack 102 above and below the fourth block 118. Yet another vertical hole 120 extends entirely through second block 114 and entirely through third block 116 as well as through portions of the stack 102 below second block 114, above third block 116 and between second block 114 and third block 116. Each of said vertical holes 120 may be filled partially or entirely with an electrically conductive structure 140. The vertical holes 120 may be formed by mechanically drilling, or alternatively by laser drilling or etching. The vertical holes 120 may be filled with electrically conductive structures 140 by plating (in particular by electroless plating and/or galvanically plating). Alternatively, the vertical holes 120 may be filled with electrically conductive structure 140 by inserting a respective metallic pin in each respective vertical hole 120. The above-mentioned continuous electrically conductive path (see reference sign 136 in FIG. 24 and FIG. 25) may also include (partially or entirely) the electrically conductive structures 140 in said vertical holes 120. Hence, a current transport in component carrier 100 may be accomplished inter alia via the metal-filled vertical holes 120.

The first electronic component 108 may be mounted on the first block 112 by a connection medium 144. Correspondingly, the second electronic component 110 may be mounted on the second block 114 by a connection medium 144. Preferably, the connection medium 144 may be a sinter structure (such as a silver sinter structure). Thus, it may in particular be possible to embed electronic components 108, 110 with silver backside metallization. Hence, a copper pad metallization on the backside may be dispensable for the power components 108, 110. Alternatively, it may also be possible that the connection medium 144 is a solder structure (in particular configured for diffusing soldering) or is an electrically conductive adhesive. In particular, it may be possible to connect a gate pad of a respective one of the electronic components 108, 110 with thin copper lines, whereas source pad and drain pad may be connected with thick metal (for instance by a respective block 112, 114 and the electrically conductive layer structures 104) to transfer high current and heat. In the shown embodiment, the electronic components 108, 110 are connected on a bottom side with the blocks 112, 114, respectively, by the described connection medium 144. On a top side, the electronic components 108, 110 may be connected by microvias.

According to FIG. 1, a lowermost electrically insulating layer structure 106' of the stack 102 may be a thermal prepreg which has a higher thermal conductivity (for example 1.8 W/mK) compared to the other electrically insulating layer structures 106 of the stack 102 which may have a lower thermal conductivity (for example 0.8 W/mK). Said thermal prepreg layer may provide a pronounced contribution to the heat removal towards a cooling unit 170.

As shown in FIG. 1, stack 102 may be mounted on the cooling unit 170 (such as a heat sink) with a thermal interface material 176 (which may be thermally conductive and electrically insulating) in between.

FIG. 2 to FIG. 23 illustrate cross-sectional views of structures obtained during carrying out methods of manufacturing component carriers 100 according to exemplary embodiments of the disclosure in accordance with a chip-on-block concept.

Figure 2:
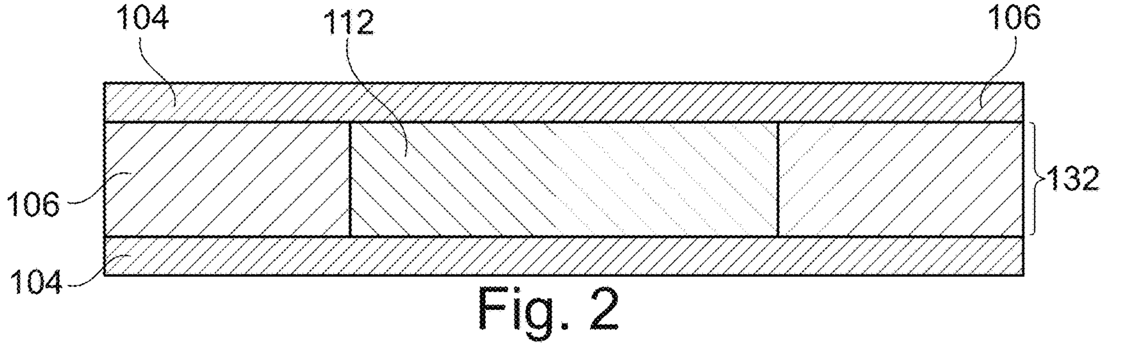
FIG. 2, FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21 and FIG. 22 illustrate cross-sectional views of structures obtained during carrying out methods of manufacturing component carriers according to exemplary embodiments of the disclosure.

Referring to FIG. 2, core 132 is shown as a thick and fully cured electrically insulating layer structure 106 (in particular made of FR4) having electrically conductive layer structures 104 attached to both opposing main surfaces thereof, for example copper foils. First block 112 is embedded in the core 132. Thus, core 132 may be fabricated with an embedded copper (or aluminum nitride) cuboid as first block 112.

Figure 3:
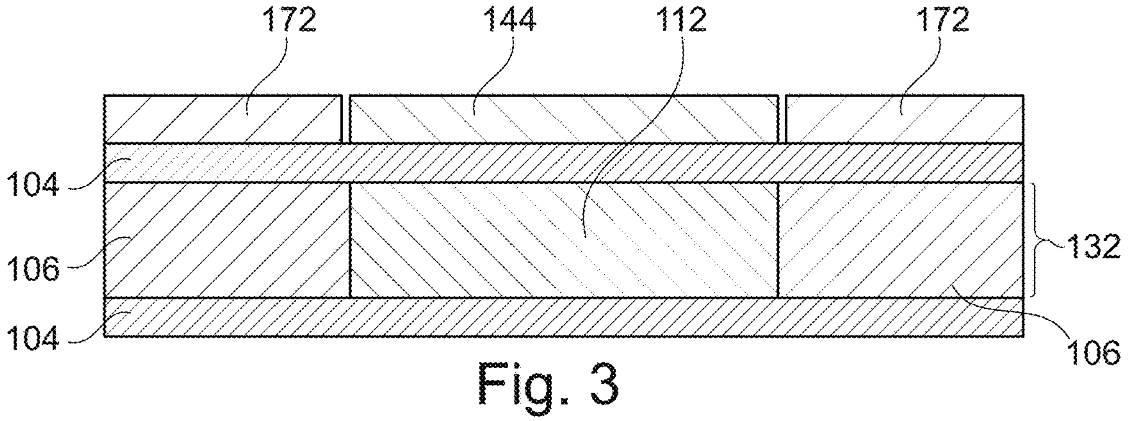

FIG. 3 shows a sinter depot printed as connection medium 144 on top of the structure shown in FIG. 2 using a stencil printing mask 172.

Figure 4:
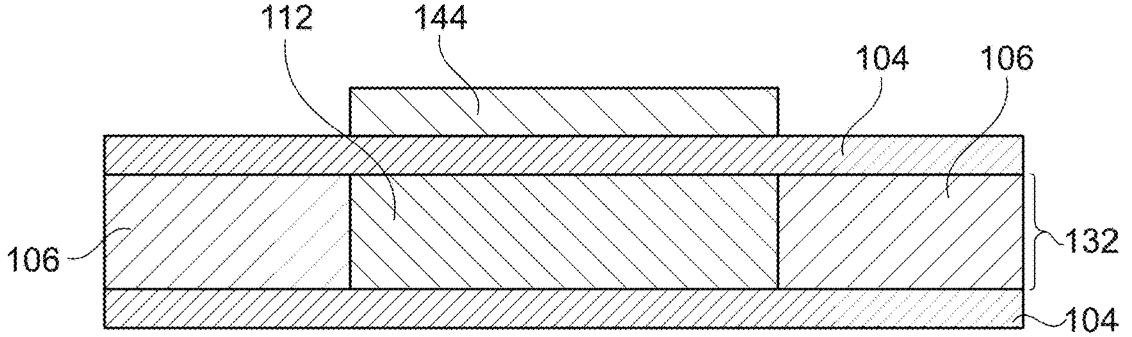

Referring to FIG. 4, the stencil printing mask 172 is removed after printing the connection medium 144 embodied as sinter depot.

Figure 5:
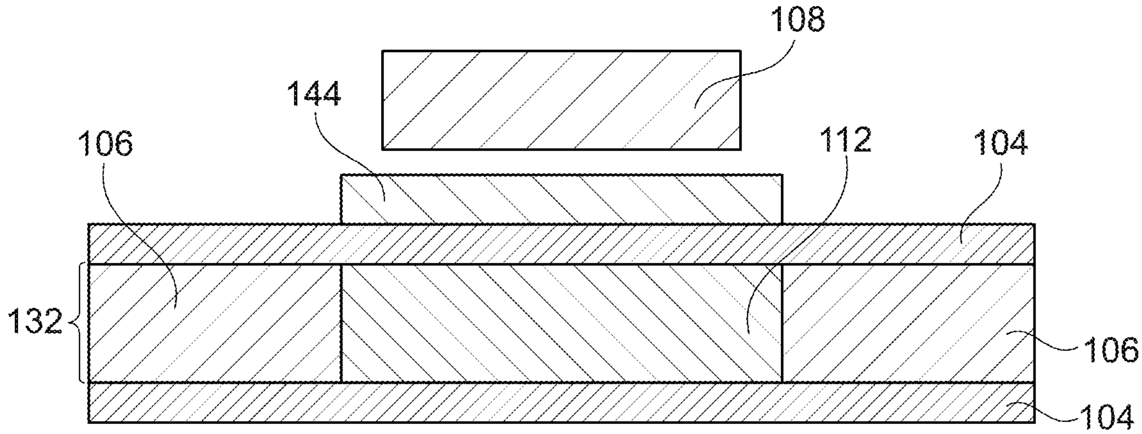

FIG. 5 shows how the first electronic component 108 is mounted or assembled on the connection medium 144. This may be accomplished by a pick and place process. As a result, the first electronic component 108 (for instance a MOSFET formed in silicon, GaN or SiC technology, an IGBT, or a diode) is arranged on the sinter depot, compare FIG. 6. It may be optionally possible to apply mechanical pressure and/or raise the temperature during assembly of the first electronic component 108 to promote adhesion on the connection medium 144.

Figure 6:
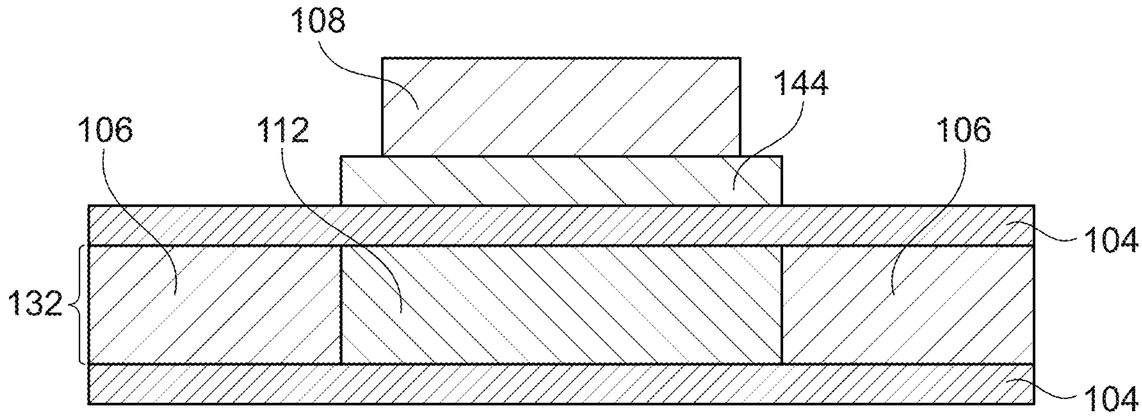
Figure 7:
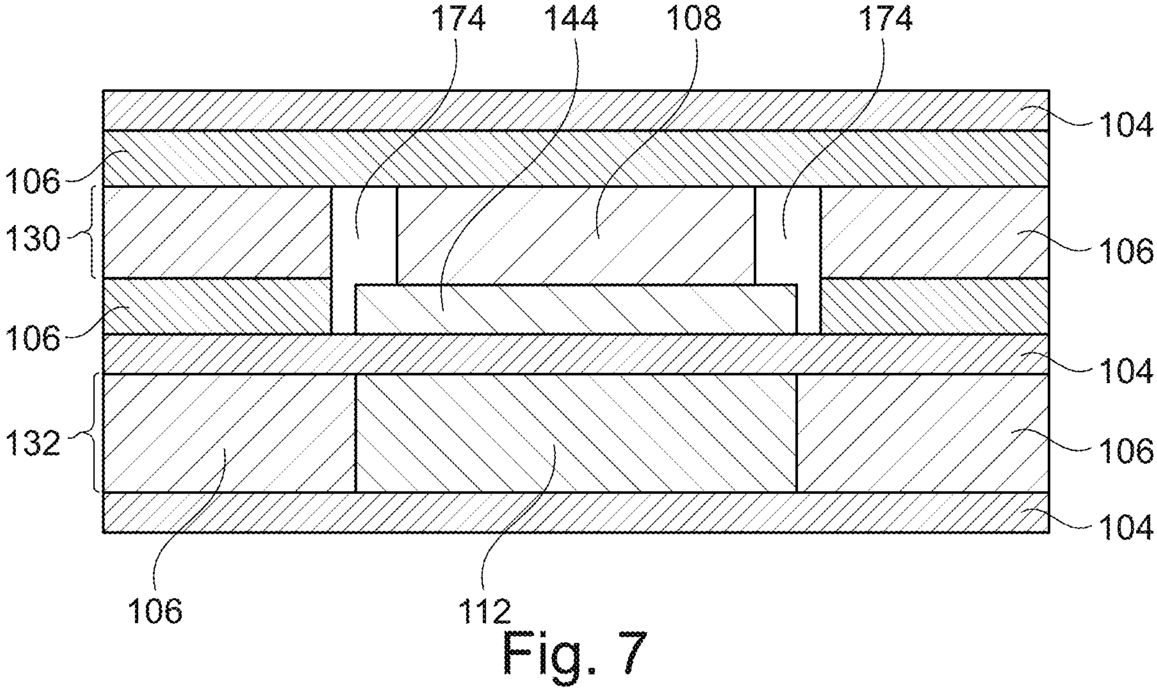

Referring to FIG. 7, a fully cured core 130 (for instance fully cured FR4) covered on both opposing main surfaces thereof with a respective at least partially uncured electrically insulating layer structure 106 (such as B-stage prepreg or resin) and having an additional electrically conductive layer structure 104 (such as a copper foil) on top may be provided with a recess or cavity 174 and may be placed on top of the structure of FIG. 6. More specifically, cavity 174 may be formed in core 130 and in the lower uncured electrically insulating layer structure 106 to thereby form a cap structure. As a result of putting the cap structure on the structure shown in FIG. 6, the first electronic component 108 and the connection medium 144 are accommodated in the cavity 174. Thus, a lay-up of a pre-cut prepreg, a pre-cut core 130 (optionally with structured copper layer, not shown), a continuous sheet of prepreg and a continuous copper foil may be provided and placed on top of the electronic component 108.

Figure 8:
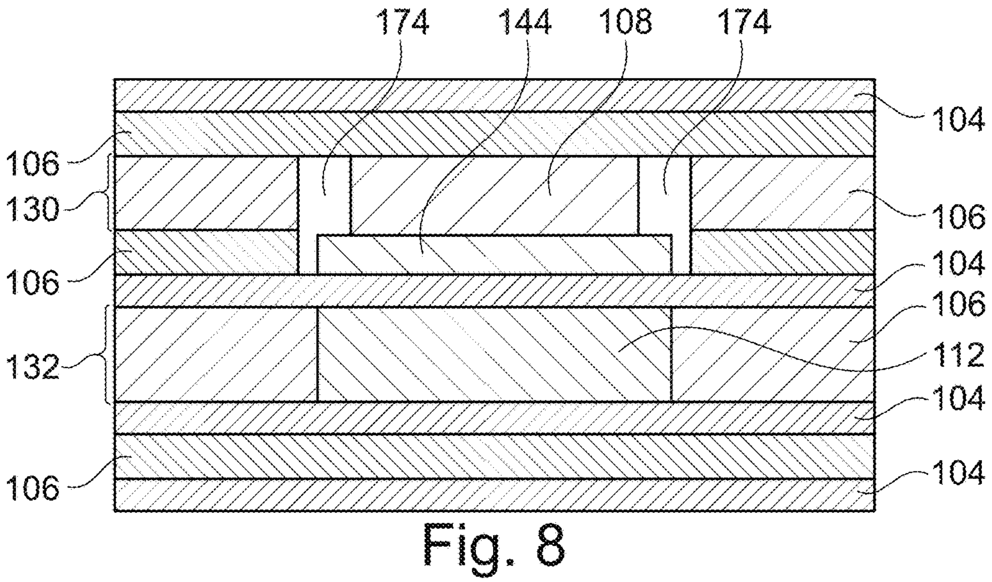

Referring to FIG. 8, a further electrically conductive layer structure 104 (such as the copper foil) and a further uncured electrically insulating layer structure 106 (such as a prepreg sheet) may be attached to a lower main surface of the structure shown in FIG. 7. Hence, a lay-up of prepreg (in this embodiment a normal prepreg) may be applied on a bottom side of the structure of FIG. 7. According to FIG. 8, the standard prepreg used as lowermost electrically insulating layer structure 106 may have a thermal conductivity of not more than 1.0 W/mK, in particular of not more than 0.8 W/mK. Thermal vias may be formed on a bottom side.

Figure 9:
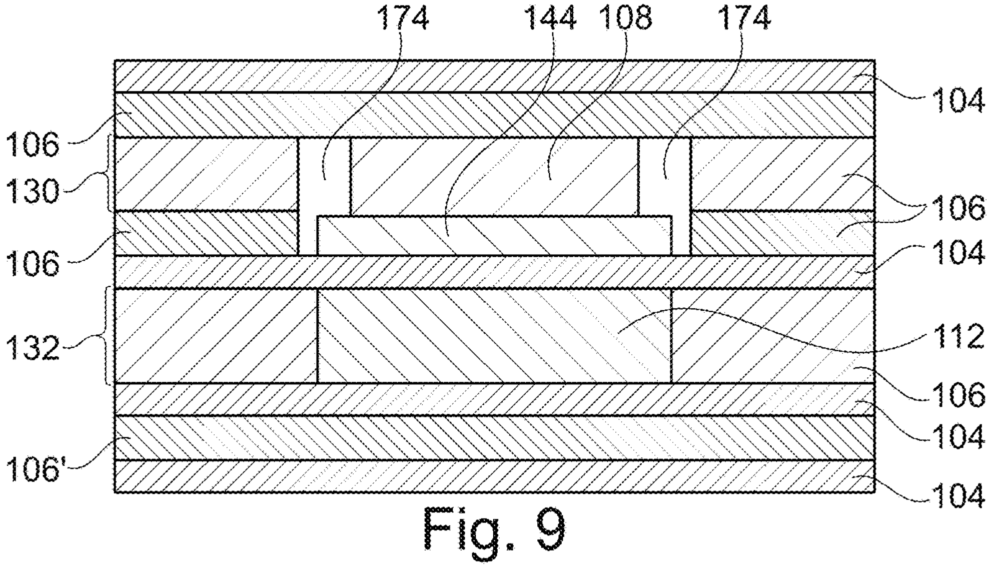

FIG. 9 is an alternative to the structure according to FIG. 8 and may also be obtained based on the structure shown in FIG. 7. According to FIG. 9, a thermal prepreg may be applied as uncured electrically insulating layer structure 106' at a bottom side, together with a further electrically conductive layer structure 104. For instance, the thermal prepreg may have a thermal conductivity of more than 1.0 W/mK, in particular of more than 1.8 W/mK. For instance, no thermal vias are formed on the bottom side of the structure of FIG. 9.

Hence, the embodiments of FIG. 8 and FIG. 9 differ concerning the thermal conductivity of the lowermost electrically insulating layer structures 106/106' and/or concerning the presence or absence of thermal vias.

After having formed the structures shown in FIG. 8 and FIG. 9, a lamination process may be carried out by the application of pressure and/or heat. Cavities 174 are filled with resin from the previously uncured electrically insulating layer structures 106 during the lamination process. Descriptively speaking, the two at least partially uncured electrically insulating layer structures 106 (one being a continuous sheet and the other one being pre-cut) may become flowable during lamination and may thus flow into cavity 174. By the elevated temperature and/or the mechanical pressure applied during lamination, said previously uncured electrically insulating layer structures 106 may be cured (for instance by polymerizing, cross-linking, etc.) and may thereby be re-solidified.

Figure 10:
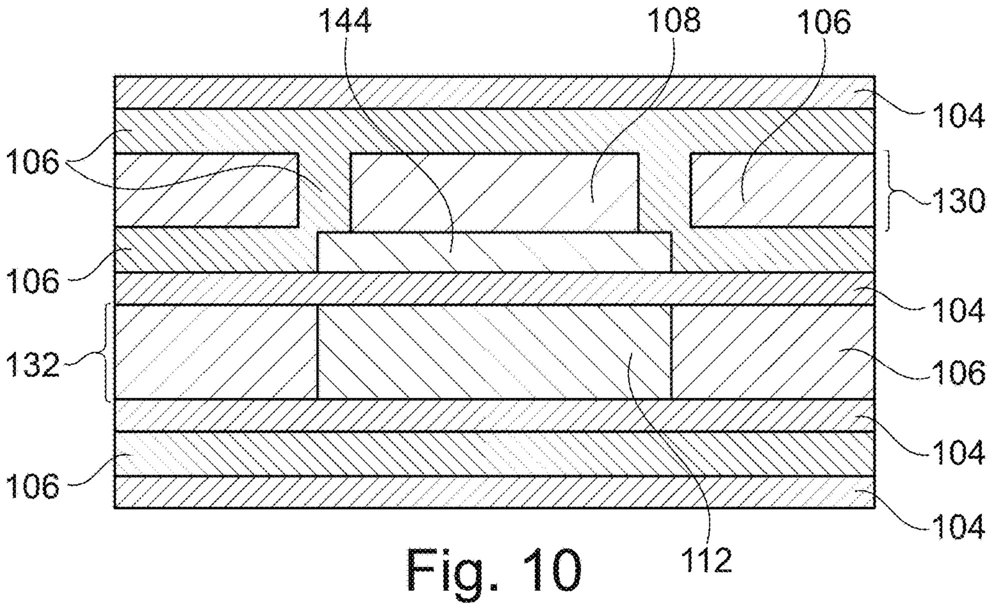
Figure 11:
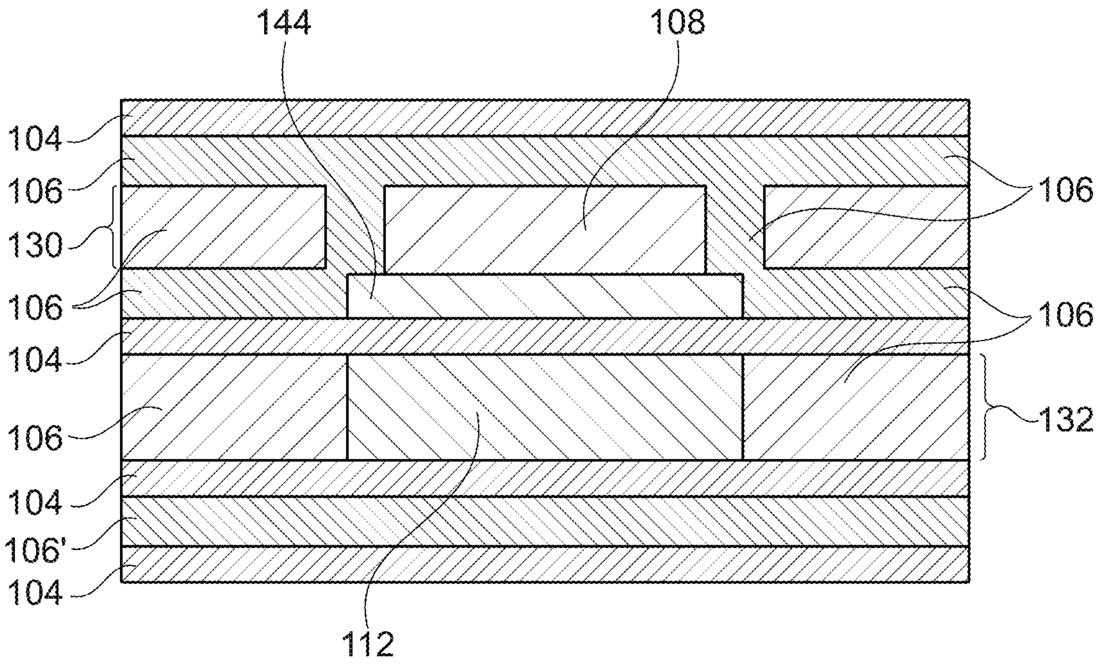

FIG. 10 shows the result of the lamination process starting from the embodiment according to FIG. 8. FIG. 11 shows the result of the lamination process starting from the alternative embodiment according to FIG. 9.

Thereafter, via drilling may be carried out, for instance by laser drilling. The obtained drill holes may be filled with electrically conductive material such as copper, for instance by plating. The exterior electrically conductive layer structures 104 may then be structured to thereby obtain a patterned metal layer. Subsequently, the stack 102 may be mounted on a cooling unit 170, preferably with a thermal interface material 176 between the stack 102 and the cooling unit 170.

Figure 12:
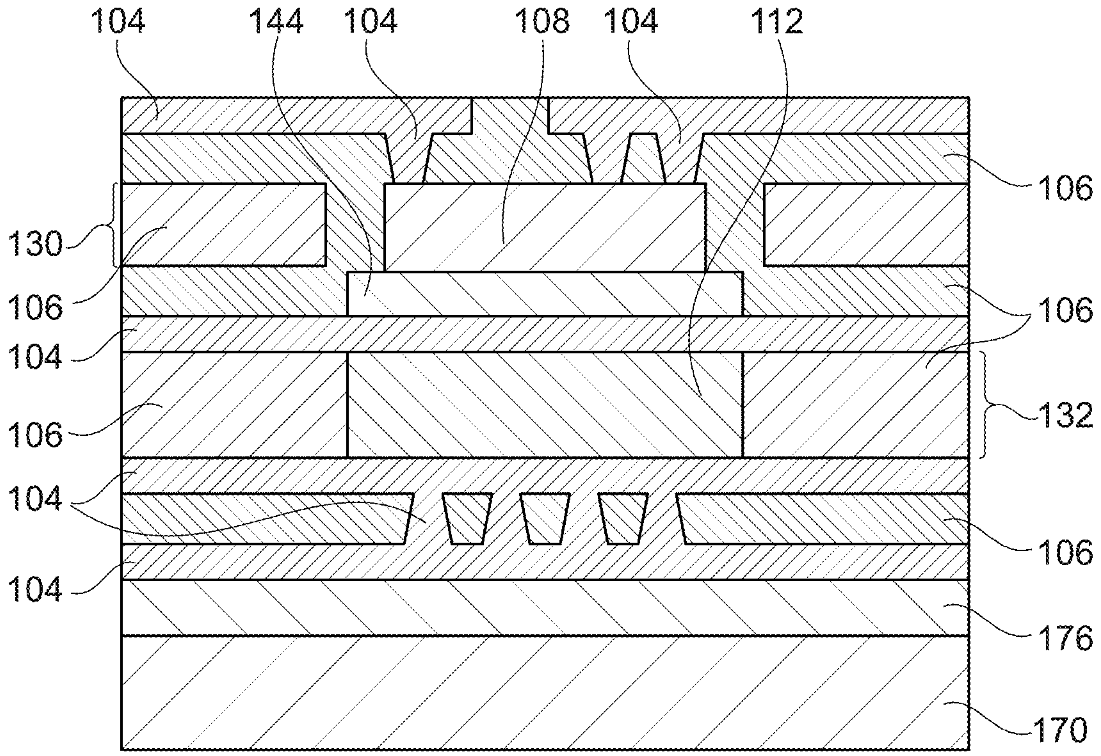
Figure 13:
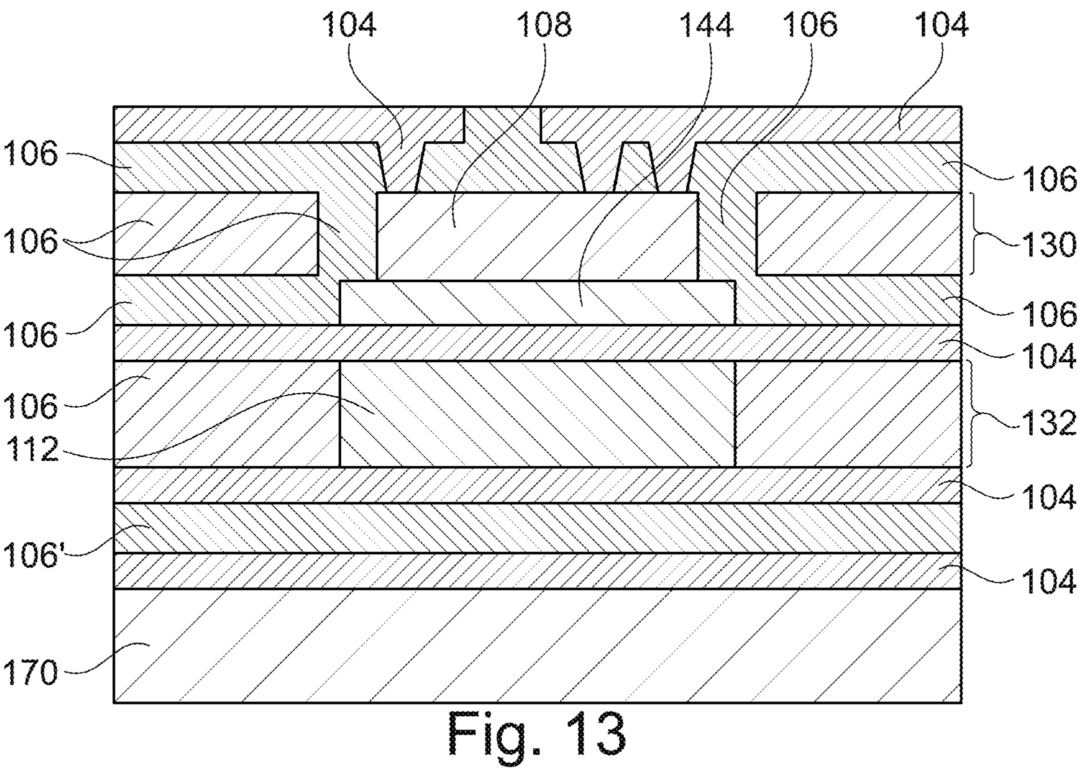

FIG. 12 shows the results of the described processes for the embodiment according to FIG. 10, whereas FIG. 13 shows the results of the described processes for the embodiment according to FIG. 11.

Figure 14:
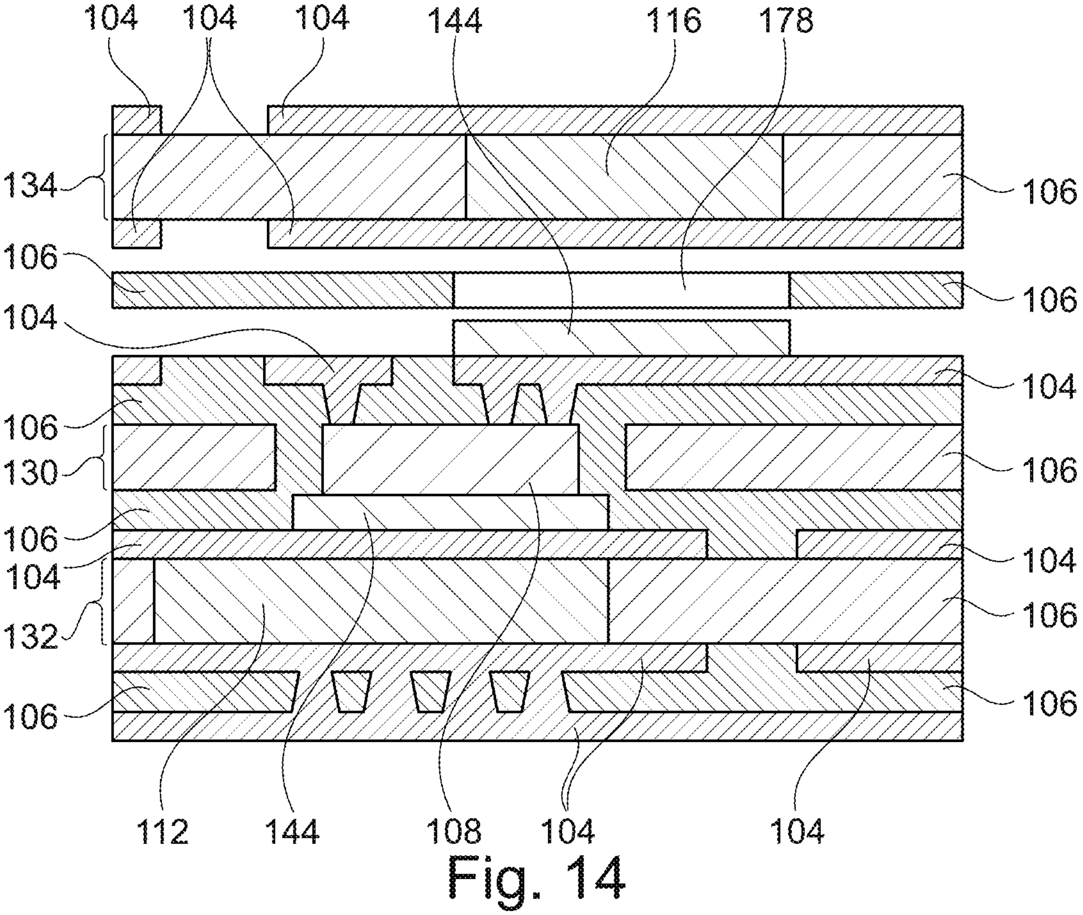
Figure 15:
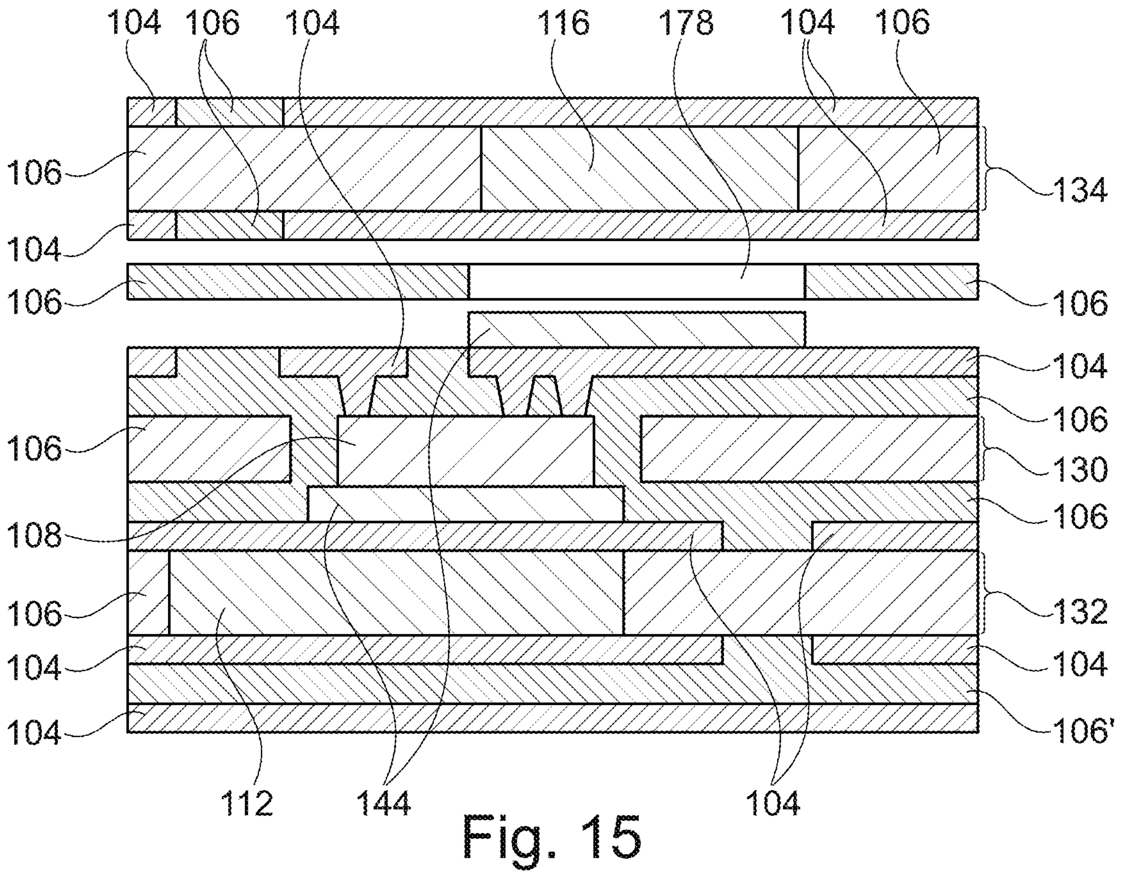

After the described processes of micro via contacting and now referring to FIG. 14 (corresponding to the embodiment of FIG. 12) and FIG. 15 (corresponding to the embodiment of FIG. 13), the manufacturing process may proceed with applying a connection medium 144 (such as a sinter depot) on the stack-up, i.e. on the upper main surface of the processed layer stack. Apart from this, a further thermally conductive and electrically conductive block 116 may be embedded in a further core 134 which may be cladded with patterned further electrically conductive layer structures 104 on both sides. A further pre-cut uncured electrically insulating layer structure 106, having a through hole 178 aligned with the connection medium 144, may be interposed between the structure shown in FIG. 12/FIG. 13 with the connection medium 144 thereon on the one hand and the further core 134 with the embedded block 116 on the other hand. Thereafter, said three constituents may be connected by lamination using the interposed further pre-cut uncured electrically insulating layer structure 106 (which may be denoted as pacer prepreg) as source of flowable resin which is cured during lamination.

Figure 16:
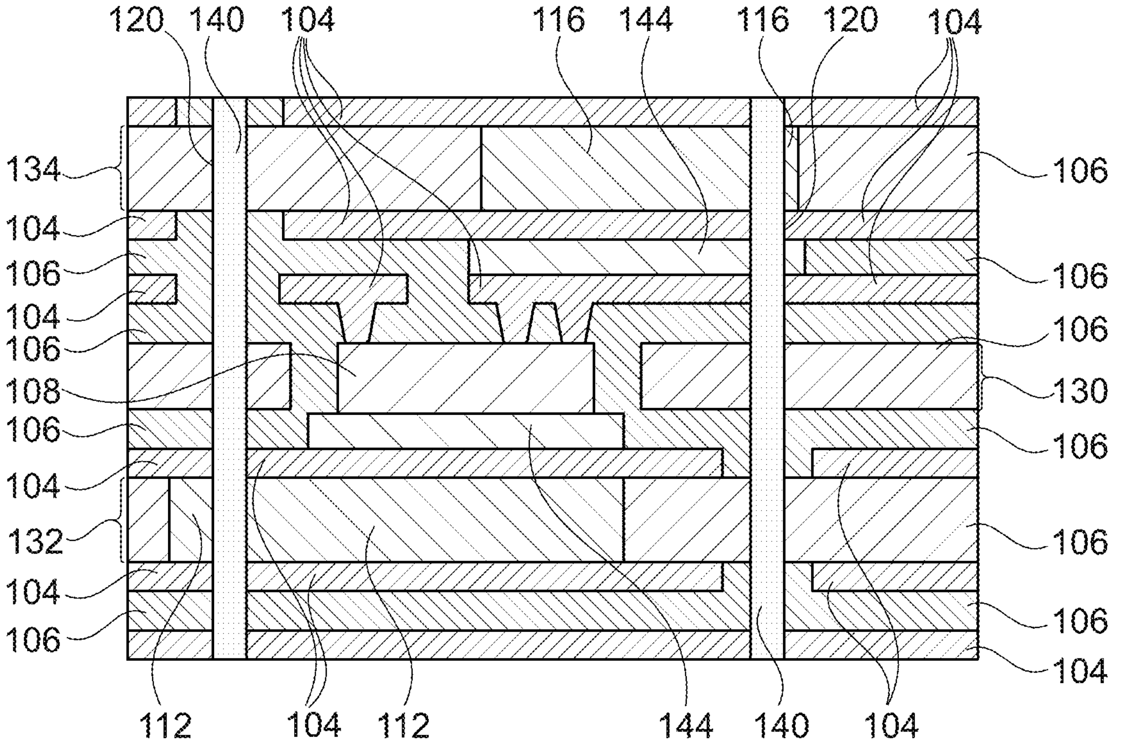
Figure 17:
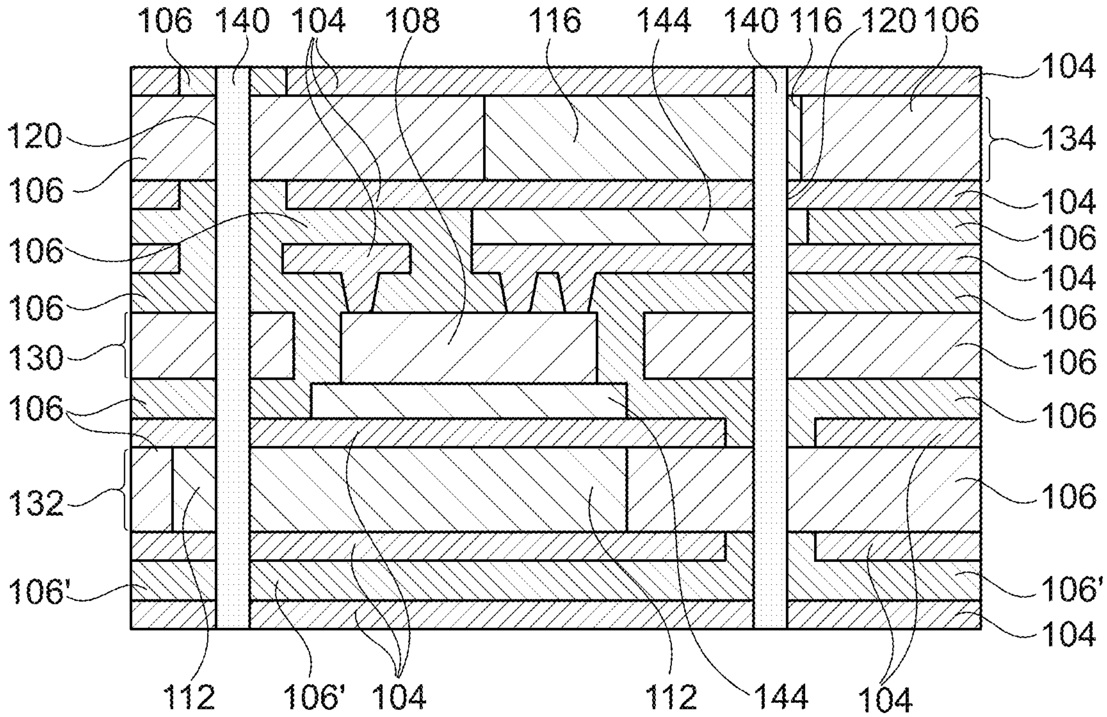

The resulting structures are shown, after drilling of vertical through holes 120 through the entire structures, in FIG. 16 (corresponding to FIG. 14) and in FIG. 17 (corresponding to FIG. 15), respectively. Drilling the vertical through holes 120 may be accomplished by mechanically drilling. As shown, the vertical holes 120 may also extend through the entire blocks 112, 116. The vertical holes 120 may be filled, partially or entirely, by electrically conductive structures 140. For instance, this may be accomplished by plating. Alternatively, a metallic pin may be inserted in the vertical holes 120 as electrically conductive structure 140.

Figure 18:
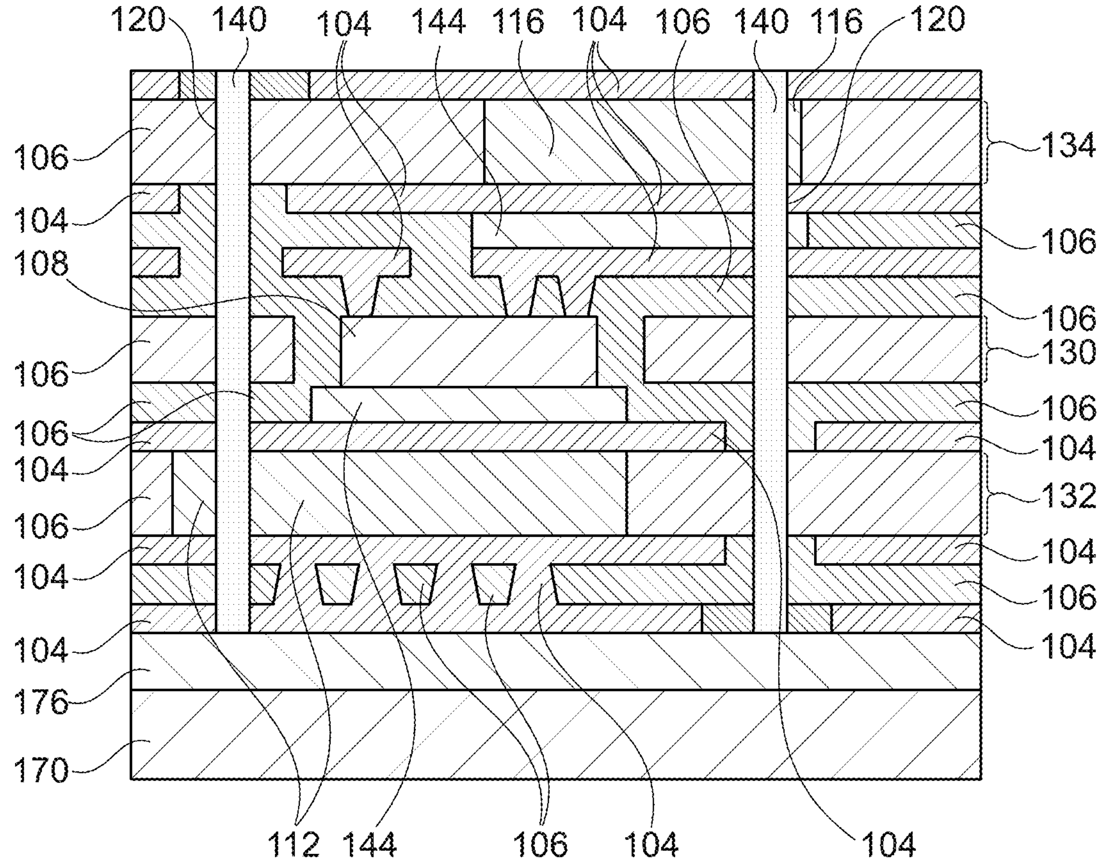

Referring to FIG. 18, the structure of FIG. 16 may be connected to thermal interface material 176 and cooling unit 170. As shown in FIG. 18, it may also be possible to form micro vias, as described above referring to FIG. 12 and FIG. 13.

Figure 19:
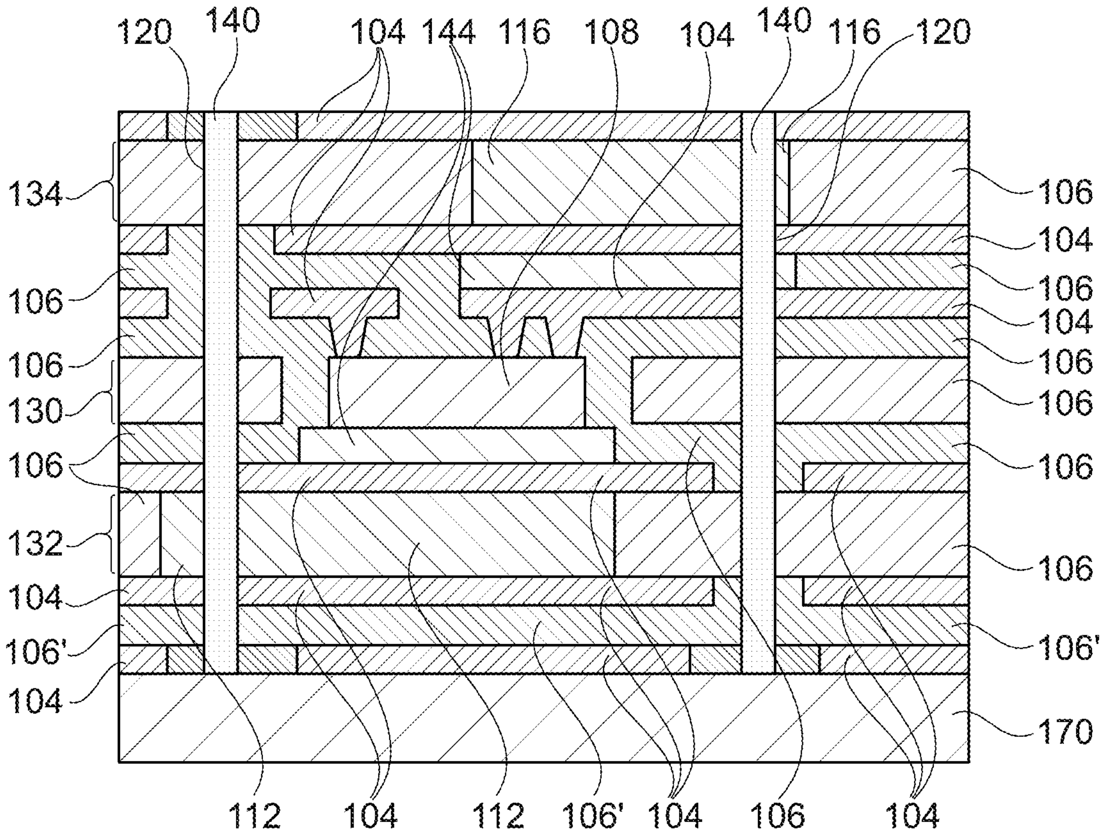

FIG. 19 shows the structure of FIG. 17 connected to a cooling unit 170.

Figure 20:
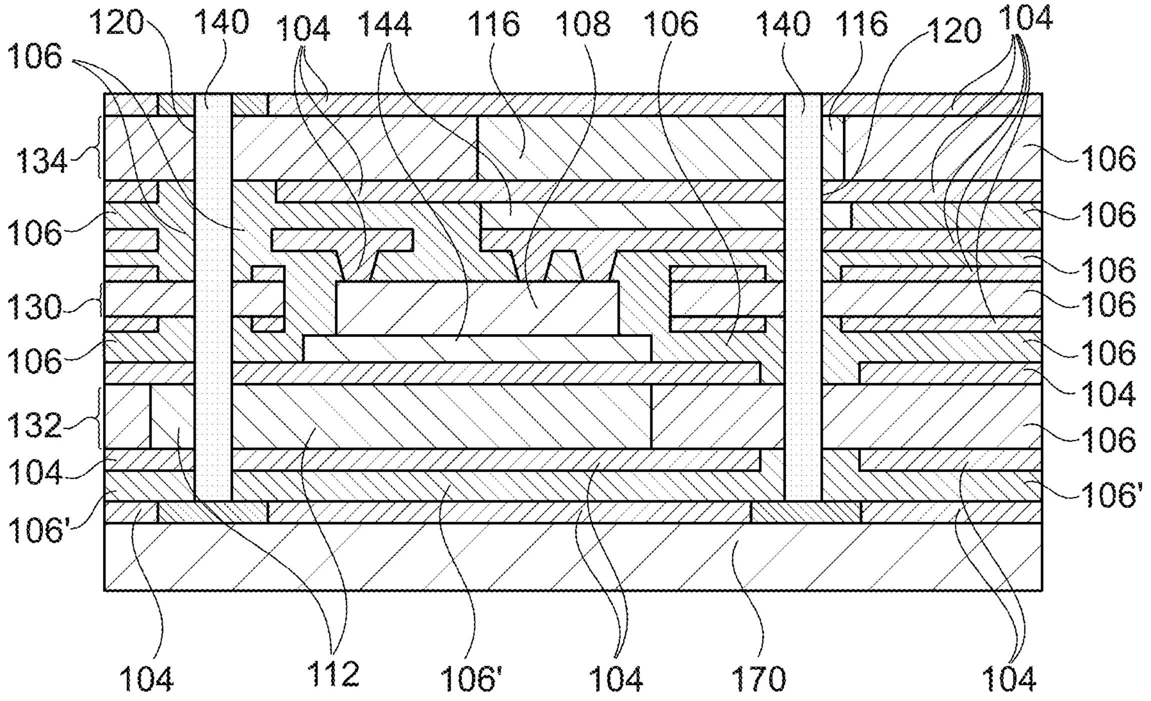

FIG. 20 shows a variant to the embodiment of FIG. 19 with eight layers, a thermal prepreg on the bottom side, and two press cycles.

Figure 21:
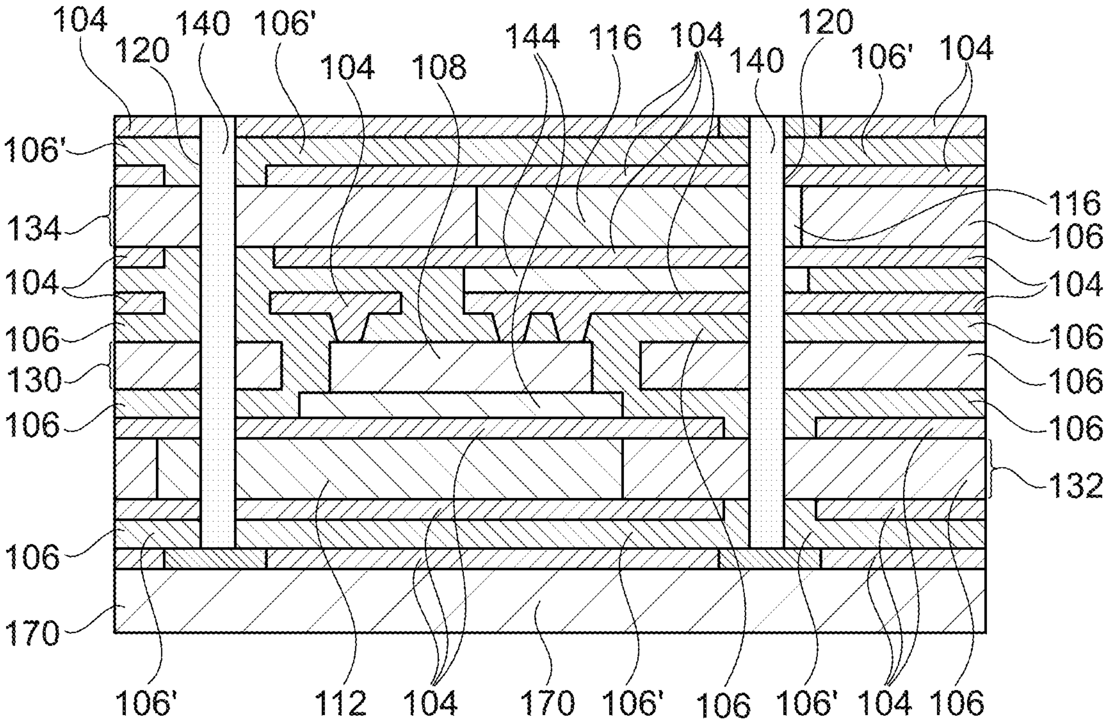

FIG. 21 shows a further variant to the embodiment of FIG. 19 with seven layers, a thermal prepreg (see reference sign 106') on the top side and on the bottom side, and three press cycles.

Figure 22:
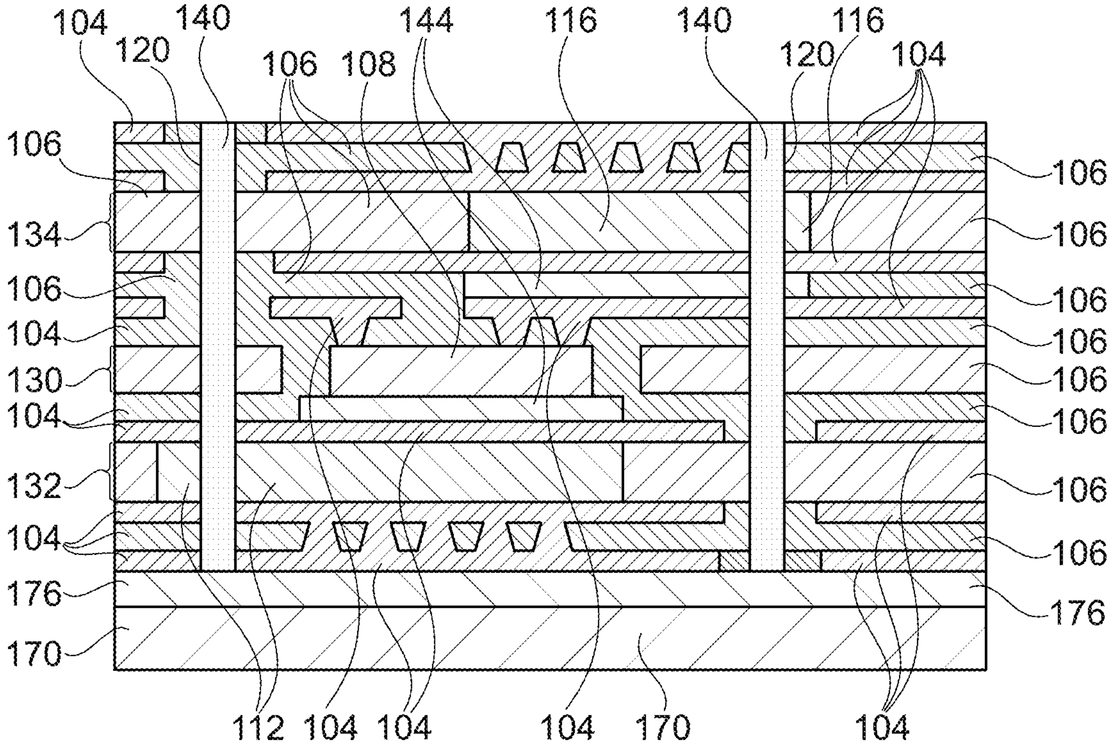

Referring to FIG. 22, a variant to the embodiment of FIG. 18 with seven layers, an ordinary prepreg on the top side and on the bottom side, and three press cycles is shown.

Figure 23:
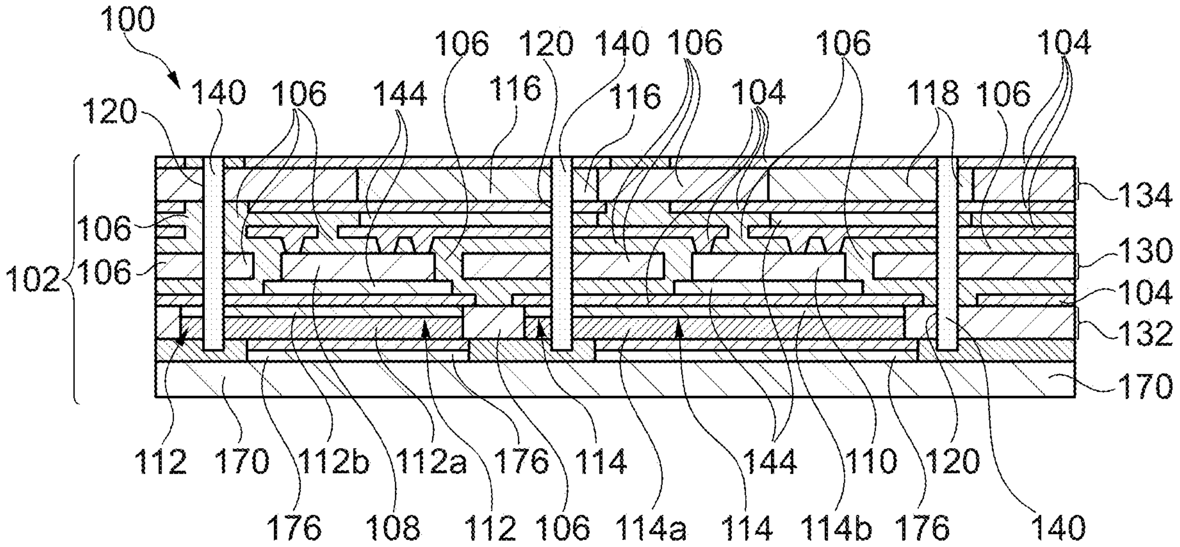
FIG. 23 illustrates a cross-sectional view of a component carrier according to another exemplary embodiment of the disclosure.

FIG. 23 illustrates a cross-sectional view of a component carrier 100 according to another exemplary embodiment of the disclosure. The embodiment of FIG. 23 differs from the embodiment of FIG. 1 in particular in that, according to FIG. 23, each of said blocks 112, 114 (rather than consisting of copper) comprise a respective ceramic block 112*a*, 114*a* covered with a respective electrically conductive layer 112*b*, 114*b* on a top side (and/or on a bottom side) of the respective ceramic block 112*a*, 114*a*. Each ceramic block 112*a*, 114*a* may be made for example of aluminum nitride. The embodiment shown in FIG. 23 does not have a thermal prepreg on the bottom side but may have such a thermally conductive electrically insulating layer structure 106' in yet another embodiment.

In particular, the embedded electronic components 108, 110 may be MOSFET chips which can be manufactured for instance in Si, GaN, SiC, GaAs, or GaS technology. Alternatively, the electronic components 108, 110 may be for instance IGBTs, diodes, etc.

All electrically conductive layer structures 104 (in particular copper layers) can be designed as signal layers (for instance made of copper foils or layers having a thickness of 35 μm).

More generally, the electrically conductive layer structures 104 may for instance have a thickness in a range from 10 μm to 50 μm, in particular from 20 μm to 40 μm. The initially uncured electrically insulating layer structures 106 may have a thickness in a range from 10 μm to 80 μm, in particular in a range from 20 μm to 70 μm. The cores 130, 132, 134 may for instance have a thickness in a range from 100 μm to 700 μm, in particular from 200 μm to 500 μm. The blocks 112, 114, 116, 118 may for instance have a thickness of at least 100 μm, in particular in a range from 100 μm to 700 μm, more particularly from 200 μm to 500 μm.

Figure 24:
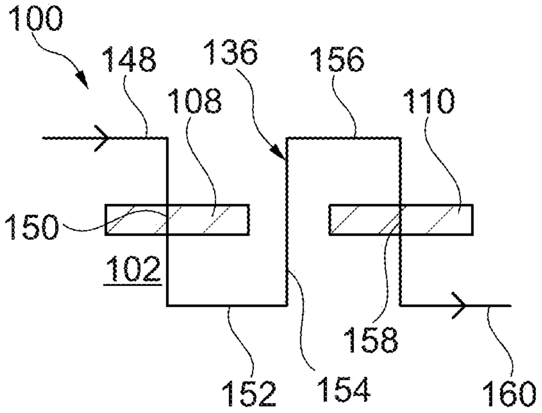
FIG. 24 illustrates a cross-sectional view and FIG. 25 illustrates a plan view showing a path of electric current flowing through a component carrier according to an exemplary embodiment of the disclosure.
Figure 25:
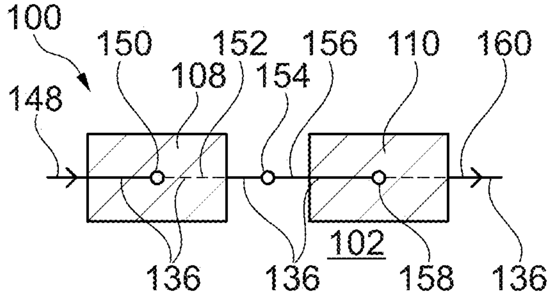

FIG. 24 illustrates a cross-sectional view and FIG. 25 illustrates a plan view showing a path 136 of electric current flowing through a component carrier 100 according to an exemplary embodiment of the disclosure, in particular the one shown in FIG. 1 or in FIG. 23.

As shown, in the cross-sectional view of the component carrier 100 according to FIG. 24, a current path 136 is established which has a horizontal section 148 (which may correspond to a current flow through an electrically conductive layer structure 104), a subsequent vertical section 150 extending through the first electronic component 108, a subsequent horizontal section 152 (which may correspond to a current flow through connection medium 144 and an electrically conductive layer structure 104), a subsequent vertical section 154 extending between the first electronic component 108 and the second electronic component 110 (which may correspond to a current flow through the central metal filled vertical hole 120), a subsequent horizontal section 156 (which may correspond to a current flow through an electrically conductive layer structure 104), a subsequent vertical section 158 extending through the second electronic component 110, and a subsequent horizontal section 160 (which may correspond to a current flow through a further connection medium 144 and an electrically conductive layer structure 104). The illustrated path 136 provides a very small parasitic capacitance.

Figure 26:
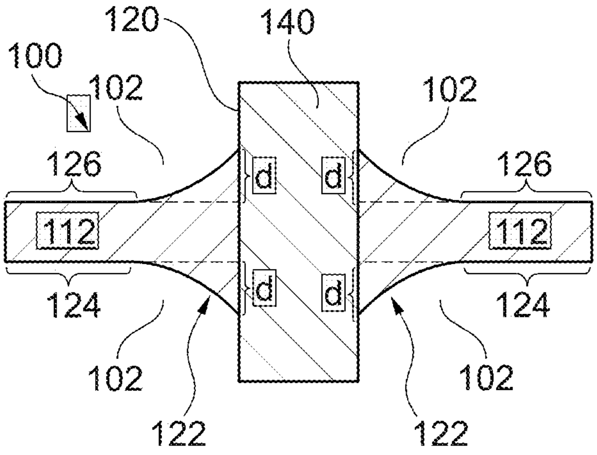
FIG. 26 illustrates a cross-sectional view of a part of a component carrier according to still another exemplary embodiment of the disclosure.

FIG. 26 illustrates a cross-sectional view of a part of a component carrier 100 according to still another exemplary embodiment of the disclosure. However, the features described in the following referring to FIG. 26 may be implemented as well in other embodiments of the disclosure, for instance the ones of FIG. 1 or FIG. 23. More specifically, FIG. 26 shows a detail of component carrier 100 around an intersection between a metal-filled vertical through hole 120 and a copper block 112 traversed by said metal-filled vertical through hole 120.

As shown, the thermally conductive and electrically conductive metal block 112 is embedded in a laminated layer stack 102, which may be constructed as described above. The vertical hole 120 extends through part of the stack 102 and through the entire block 112, and may be formed for example by mechanically drilling. As shown, the block 112 has a nail head structure 122 surrounding the vertical hole 120 circumferentially, protruding downwardly beyond a planar portion 124 of a lower main surface of the block 112 and protruding upwardly beyond a planar portion 126 of an upper main surface of the block 112 (which can be cuboid before drilling). Such a nail head structure 122 may be formed by a ductile deformation of metallic material of block 112 during mechanically drilling or laser drilling the vertical hole 120, i.e. by the drilling energy impact. Descriptively speaking, the copper material may be partially displaced.

As shown as well, the electrically conductive contact structure 140 in the vertical hole 120 establishes an electrically conductive connection with the block 112 along the nail head section 122. Due to the vertically elongate geometry of the nail head section 122, the electric contact between the contact structure 140 and the metallic block 112 is highly reliable thanks to the large connection area provided by the nail head section 122. For instance, the contact structure 140 may be a plated metal structure (for instance formed by electroless deposition and/or galvanic deposition) or a metallic pin pressed into the vertical hole 120. As shown, the nail head structure 122 protrudes upwardly and downwardly beyond the respective planar portion 124, 126 by a respective distance, d. Preferably, each of the distances, d, may be in a range from 5 μm to 70 μm which guarantees a highly reliable electrical connection between deformed block 112 and contact structure 140. Descriptively speaking, the nail head structure 122 is created by metal forming of metallic material of the block 112 due to an energy impact by the formation of the vertical hole 120, in particular by mechanically drilling using a drill bit.

The extent of the nail-head structure 122 strongly depends on the process parameters during drilling. The higher the drilling speed the more copper will be displaced (due to its ductile properties) leading to the structure of a nail-head. Another influencing factor is the amount of prepreg present on the surface. The softer the applied material on top of the copper block 112, the larger will be the perimeter of the nail-head structure 122.

Figure 27:
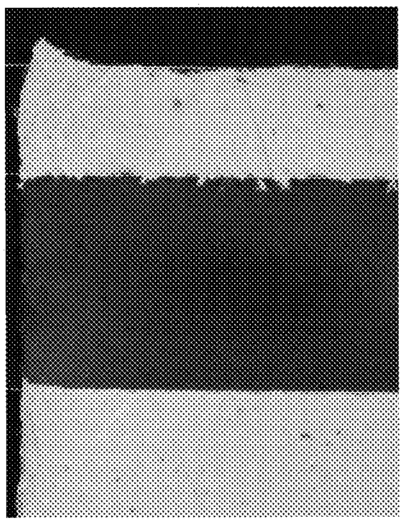
FIG. 27 illustrates a cross-sectional view of a part of a component carrier according an exemplary embodiment of the disclosure with a nail head structure.

FIG. 27 illustrates a cross-sectional view of a part of a component carrier 100 according an exemplary embodiment of the disclosure with a nail head structure 122. FIG. 27 shows a drilled copper inlay, in which the obtained nail-head structure has been obtained by drilling with a low drilling speed. The presence of the nail-head structure 122 can be confirmed with FIG. 27.

Figure 28:
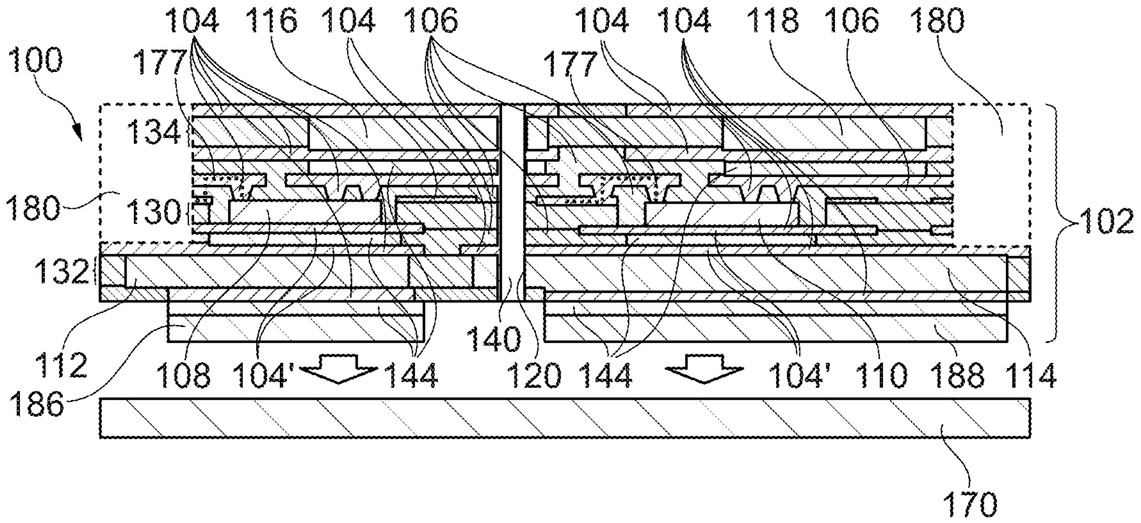
FIG. 28 illustrates a cross-sectional view of a component carrier according to another exemplary embodiment of the disclosure.
Figure 29:
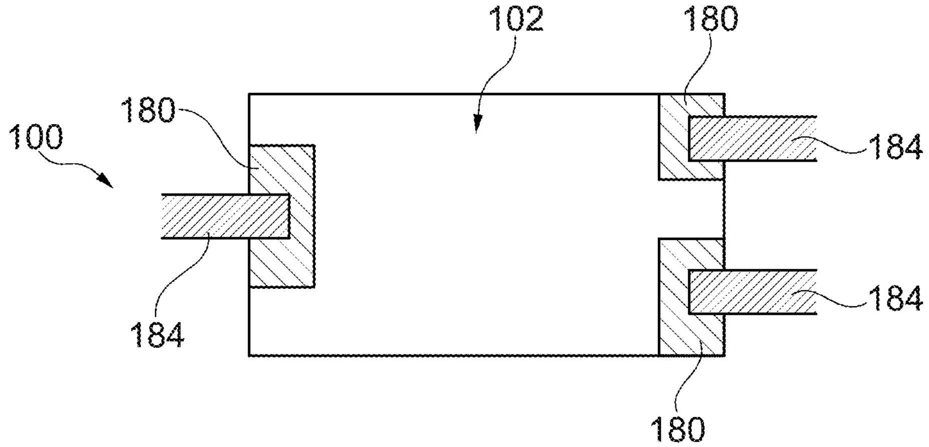
FIG. 29 illustrates a simplified plan view of the component carrier according to FIG. 28.

FIG. 28 illustrates a cross-sectional view of a component carrier 100 according to another exemplary embodiment of the disclosure. FIG. 29 illustrates a plan view of the component carrier 100 according to FIG. 28. The component carrier 100 of FIG. 28 and FIG. 29 can be denoted as a module with segmented ceramic sintered on a cooler.

According to FIG. 28, a sinter-type connection medium 144 is provided beneath each of the electronic components 108 and 110 as well as beneath third block 116 and first block 118 in an interior of the stack 102. By taking this measure, it may be possible to connect the first electronic component 108 and the second electronic component 110 as well as blocks 116, 118 by a sinter depot embedded in stack 102 in a simple and efficient way being properly compatible with component carrier manufacturing technology. Furthermore, further thermally conductive blocks 186, 188 may be connected at a bottom of the stack 102 by sinter-type connection medium 144.

The first block 112, the second block 114, and power current wiring structures 104' being arranged beneath and being electrically coupled with the first electronic component 108 and the second electronic component 110 are configured as power bus with high current carrying capacity of at least 50 Ampère, preferably more. In order to achieve this, any of the first block 112, the second block 114, and/or the power current wiring structures 104' may have a copper thickness beneath the respective one of the first electronic component 108 and the second electronic component 110 of at least 300 μm, preferably more.

As can be taken both from the cross-sectional view of FIG. 28 and the (sort of) plan view of FIG. 29, a plurality of side cavities 180 are formed in opposing lateral end sections of the stack 102. Again referring to FIG. 28, a respective one of the power current wiring structures 104' is exposed in each of the side cavities 180 to form part of a stack-internal power bus with high current carrying capacity, for instance at least 50 Ampère. As shown in FIG. 29, each exposed portion of the stack-internal power bus in the side cavities 180 may be connected with a power connector 184 (for example a power pin) by which a power signal may be supplied to the component carrier 100. This makes the component carrier of FIG. 28 and FIG. 29 highly appropriate for automotive and locomotive applications, being very demanding in terms of ampacity.

Again referring to FIG. 28, the component carrier 100 comprises further thermally conductive blocks 186, 188 below the first block 112 and below the second block 114 for conducting heat from the first electronic component 108 and the second electronic component 110 via the further thermally conductive blocks 186, 188 towards a cooling unit 170, such as a heat sink. More specifically, a first further thermally conductive block 186 is provided below and is thermally connected with the first block 112. Moreover, a second further thermally conductive block 188 is located below and is thermally connected with the second block 114. As indicated by arrows in FIG. 28, this allows to properly define heat removal paths from the embedded components 108, 110 via blocks 112, 114 and further blocks 186, 188 towards cooling unit 170.

As already mentioned above, the electrically conductive layer structures 104 comprise power current wiring structures 104' for supplying electric power to power terminals of the first electronic component 108 and the second electronic component 110. For example, the first electronic component 108 and/or the second electronic component 110 may be a field effect transistor chip (more specifically a MOSFET chip). In such an embodiment, the power current wiring structures 104' may be electrically conductive paths for supplying a power signal to power terminals such as a source terminal and/or a drain terminal of the respective electronic component 108, 110. Again referring to FIG. 28, the electrically conductive layer structures 104 may further comprise control wiring structures 177 (see dotted lines) for supplying a control signal to control terminals of the first electronic component 108 and the second electronic component 110. Again referring to the above example of field effect transistor chips forming the first electronic component 108 and the second electronic component 110, the control terminals may be gate terminals and the control signals may be gate control signals controlling switching of the field effect transistor chip-type first and second electronic components 108, 110. Advantageously, the power current wiring structures 104' may be provided along a spatially separate electric path compared with the control wiring structures 177, so that power signals and control signals may be reliably kept separate.

Advantageously, the control wiring structures 177 may be provided in common for both the first electronic component 108 and the second electronic component 110. More specifically, the common control wiring structures 177 may be configured for supplying a control signal to the control terminals of the first electronic component 108 and the second electronic component 110 with substantially identical control signal path lengths. This may ensure a proper control of the electronic components 108, 110 without mutual delay, so that an excellent switching performance may be achieved.

In view of the foregoing circuitry, the gate line of each of the field effect transistor-type electronic components 108, 110 may be spatially separated from the power lines and may be guided in a thin copper layer (for instance having a thickness in a range from 10 μm to 40 μm). Advantageously, a corresponding electrically conductive layer structure 104/104' may be located inside the stack 102, for example between two power layers (see dotted lines in FIG. 28). In such an embodiment, a copper layer of core 130, in which the respective electronic component 108, 110 is embedded, may be used for guiding or conducting the control signal, which may only for a short path length ascend to the next level in order to be able to contact the respective pad of the respective electronic component 108, 110. Optionally, said path can also lead directly (i.e. without via) to the respective electronic component 108, 110. In still another embodiment, the package-type component carrier 100 may have a node of the signal line to guarantee approximately the same path length to the MOSFETs, which may further improve the characteristics of the circuitry.

Figure 30:
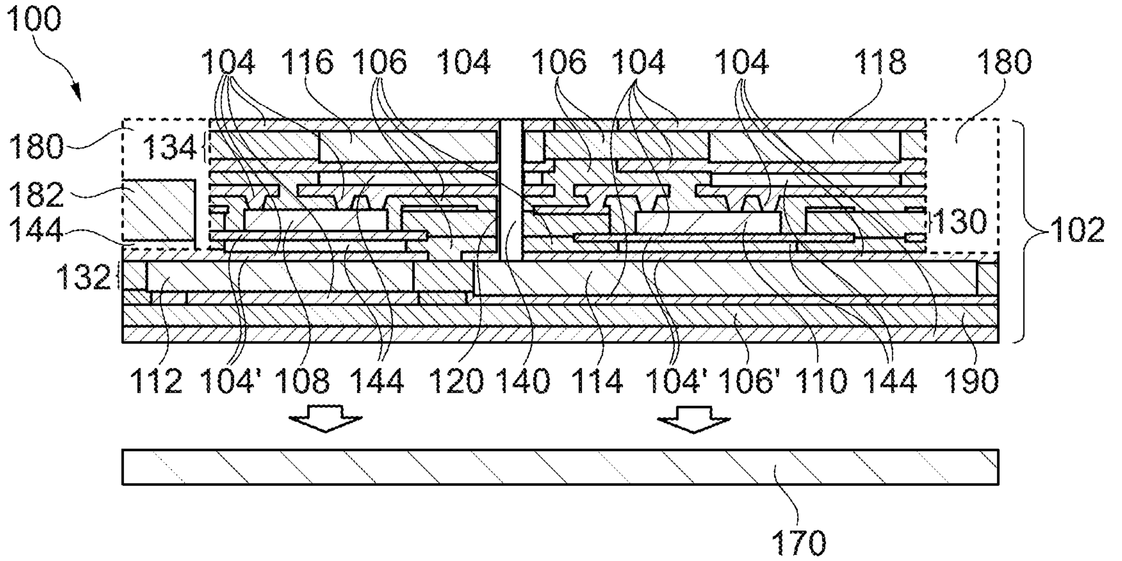
FIG. 30 illustrates a cross-sectional view of a component carrier according to another exemplary embodiment of the disclosure.

FIG. 30 illustrates a cross-sectional view of a component carrier 100 according to another exemplary embodiment of the disclosure. The component carrier 100 of FIG. 30 can be denoted as a module with thermal prepreg and copper area to be sintered on a cooler.

In the embodiment of FIG. 30, and in contrast to the embodiment of FIG. 28, an electrically conductive connection block 182 (only one is shown) is arranged in and is exposed in a respective one of the side cavities 180 and forms part of a power bus with high current carrying capacity. Although not shown in FIG. 30, the electrically conductive connection block 182, which may be a copper block, may be connected as well with a power connector 184 to supply electric power to the internal power bus of the component carrier 100, in a way as shown in FIG. 29.

Advantageously, component carrier 100 according to FIG. 30 comprises a continuous thermally conductive and electrically insulating structure 190 arranged below the first block 112 and below the second block 114 and extending over the entire width of the stack 102. Descriptively speaking, the continuous thermally conductive and electrically insulating structure 190 forms a thermal dielectric plane preventing electricity to propagate downwardly. Thus, the continuous thermally conductive and electrically insulating structure 190 decouples an electric path above from a thermal path below. According to FIG. 30, the continuous thermally conductive and electrically insulating structure 190 is embodied as a homogeneous thermally conductive and electrically insulating layer, realized as a layer of thermal prepreg which may have a higher value of thermal conductivity than the other prepreg material of electrically insulating layer structures 106.

Figure 31:
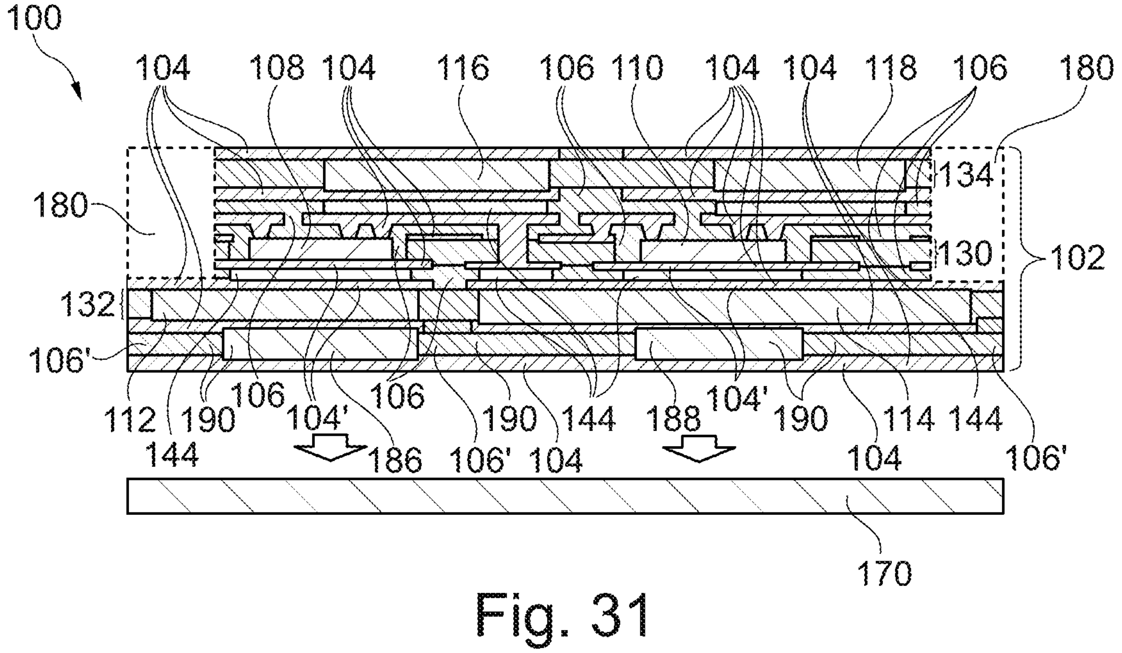
FIG. 31 illustrates a cross-sectional view of a component carrier according to another exemplary embodiment of the disclosure.

FIG. 31 illustrates a cross-sectional view of a component carrier according to another exemplary embodiment of the disclosure. The component carrier 100 of FIG. 31 can be denoted as a module with thermal prepreg and copper area to be sintered on a cooler.

Contrary to FIG. 30, the continuous thermally conductive and electrically insulating structure 190 of FIG. 31 comprises a homogeneous thermally conductive and electrically insulating layer structure, embodied as a layer structure of thermal prepreg, in which two further thermally conductive blocks 186, 188, each embodied as a ceramic inlay, are embedded with their upper main surfaces and lower main surfaces exposed beyond the homogeneous thermally conductive and electrically insulating layer structure. More specifically, a first thermally conductive block 186 is arranged below and is thermally coupled with the first block 112. Furthermore, a second thermally conductive block 188 is located below and is thermally coupled with the second block 114. In order to save costly ceramic material, the first thermally conductive block 186 has a smaller lateral extension than the first block 112 and the second thermally conductive block 188 has a smaller lateral extension than the second block 114. Hence, the embodiment of FIG. 31 combines a reasonable manufacturing effort with an excellent thermal performance.

It should be noted that the term "comprising" does not exclude other elements or steps and the article "a" or "an" does not exclude a plurality. Also, elements described in association with different embodiments may be combined.

Implementation of the disclosure is not limited to the preferred embodiments shown in the figures and described above. Instead, a multiplicity of variants are possible which variants use the solutions shown and the principle according to the disclosure even in the case of fundamentally different embodiments.

The invention claimed is:

1. A component carrier, comprising:

a stack comprising at least one electrically conductive layer structure and/or at least one electrically insulating layer structure;

a first electronic component and a second electronic component arranged in the stack;

a first block and a second block arranged in the stack below the first electronic component and the second electronic component; and a third block and a fourth block arranged in the stack above the first electronic component and the second electronic component, a first core on and/or within which the first electronic component and the second electronic component are arranged, a second core on and/or within which the first block and the second block are arranged, and a third core on and/or within which the third block and the fourth block are arranged;

a connection medium in an interior of the stack for connecting at least one of the first electronic component and the second electronic component;

wherein the first core is connected with the second and/or third core by a further electrically insulating layer structure, having a through hole aligned with the connection medium, and wherein the blocks are thermally conductive.

2. The component carrier according to claim 1, wherein each of the blocks is electrically and/or thermally coupled with at least one of the first electronic component and the second electronic component.

3. The component carrier according to claim 1, wherein each of the first electronic component and the second electronic component is a semiconductor chip.

4. The component carrier according to claim 1, wherein the stack comprises only laminated layer structures.

5. The component carrier according to claim 1, wherein at least one of the blocks comprises one of the group consisting of a metal block, a ceramic block covered with an electrically conductive layer on at least one of two opposing main surfaces of the ceramic block, and a pure ceramic block.

6. The component carrier according to claim 1, wherein the first electronic component and the second electronic component operate with a vertical current flow between opposing main surfaces thereof.

7. The component carrier according to claim 1, further comprising:

a continuous electrically conductive path which includes the at least one electrically conductive layer structure, the blocks, the first electronic component and the second electronic component or comprising at least one vertical hole extending through at least part of the stack and extending entirely through at least one of the blocks, wherein the at least one vertical hole is at least partially filled with an electrically conductive structure.

8. The component carrier according to claim 7, wherein the continuous electrically conductive path includes the electrically conductive structure in the at least one vertical hole.

9. The component carrier according to claim 1, comprising at least one of the following features:

wherein the first electronic component is mounted on the first block and the second electronic component is mounted on the second block by a connection medium;

wherein the blocks are configured for conducting electricity between the first electronic component and the second electronic component and are configured for removing heat from an assigned one of the first electronic component and the second electronic component out of the component carrier.

10. The component carrier according to claim 1, comprising at least one of the following features:

wherein, in a cross-sectional view of the component carrier, a current path is established which has a horizontal section, a subsequent vertical section extending through the first electronic component, a subsequent horizontal section, a subsequent vertical section extending between the first electronic component and the second electronic component, a subsequent horizontal section, a subsequent vertical section extending through the second electronic component, and a subsequent horizontal section;

wherein the first electronic component and the second electronic component are configured and are interconnected by the blocks and the at least one electrically conductive layer structure to provide a half-bridge function.

11. The component carrier according to claim 1, comprising at least one of the following features:

wherein the stack comprises a plurality of electrically insulating layer structures, and wherein at least one electrically insulating layer structure of the stack has a higher thermal conductivity compared to at least one remaining electrically insulating layer structure of the stack;

wherein the blocks are at least partially electrically conductive;

at least one vertical hole extending through at least part of the stack and connecting at least two of the blocks with each other;

wherein a current path for an electric voltage transport of at least 20 kV is established through the first electronic component and the second electronic component.

12. The component carrier according to claim 1, wherein at least one of the first block, the second block, and at least one power current wiring structure of the at least one electrically conductive layer structure is electrically coupled with at least one of the first electronic component and the second electronic component and is configured as at least part of a power bus with high current carrying capacity, or wherein the at least one of the first block, the second block, and the at least one power current wiring structure has a metallic thickness beneath the at least one of the first electronic component and the second electronic component of at least 300 μm.

13. The component carrier according to claim 12, wherein the power bus is configured with a high current carrying capacity of at least 10 Ampère.

14. The component carrier according to claim 1, comprising at least one of the following features:

a sinter-type connection medium in an interior of the stack;

at least one side cavity formed in at least one lateral end section of the stack);

a plurality of side cavities formed in opposing lateral end sections of the stack.

15. The component carrier according to claim 14, wherein a power current wiring structure of the at least one electrically conductive layer structure and/or at least one electrically conductive connection block is exposed in the at least one side cavity and forms at least part of a power bus with high current carrying capacity, or wherein at least one power connector being directly electrically connected with the power current wiring structure and/or the at least one electrically conductive connection block exposed in the at least one side cavity establishing a power connection of the component carrier with a power supply.

16. The component carrier according to claim 1, further comprising:

at least one further thermally conductive block below the first block and below the second block for conducting heat from the first electronic component and/or the second electronic component via the first block and/or the second block and via the at least one further thermally conductive block towards a cooling unit, or wherein the at least one further thermally conductive block comprises a first further thermally conductive block below and thermally connected with the first block and comprises a second further thermally conductive block below and thermally connected with the second block.

17. The component carrier according to claim 1, further comprising:

a continuous thermally conductive and electrically insulating structure arranged below the first block and below the second block and extending over the entire width of the stack.

18. The component carrier according to claim 17, wherein the continuous thermally conductive and electrically insulating structure comprises a homogeneous thermally conductive and electrically insulating layer.

19. The component carrier according to claim 17, wherein the continuous thermally conductive and electrically insulating structure comprises a homogeneous thermally conductive and electrically insulating layer structure in which at least one further thermally conductive block is embedded.

20. The component carrier according to claim 19, wherein the at least one further thermally conductive block comprises a first thermally conductive block below the first block and comprises a second thermally conductive block below the second block.

21. The component carrier according to claim 20, wherein the first thermally conductive block has a smaller lateral extension than the first block and/or the second thermally conductive block has a smaller lateral extension than the second block.

22. The component carrier according to claim 1, wherein the at least one electrically conductive layer structure comprises at least one power current wiring structure for supplying electric power to at least one power terminal of at least one of the first electronic component and the second electronic component and comprises at least one control wiring structure for supplying a control signal to at least one control terminal of at least one of the first electronic component and the second electronic component; and wherein the at least one power current wiring structure is provided along a spatially separate electric path compared with the at least one control wiring structure.

23. The component carrier according to claim 22, wherein the at least one control wiring structure is provided in common for both the first electronic component and the second electronic component.

24. The component carrier according to claim 23, wherein the common at least one control wiring structure is configured for supplying a control signal to the control terminals of the first electronic component and the second electronic component with substantially identical control signal path lengths.

25. A component carrier, comprising:

a stack comprising at least one electrically conductive layer structure and/or at least one electrically insulating layer structure;

a thermally conductive and/or electrically conductive block arranged in the stack;

a vertical hole extending through at least part of the stack and through the entire block, wherein the block has a nail head structure surrounding at least part of the vertical hole and protruding downwardly beyond a planar portion of a lower main surface of the block and protruding upwardly beyond a planar portion of an upper main surface of the block; and a contact structure in at least part of the vertical hole forming a connection with the block along the nail head structure, wherein the contact structure is an electrically conductive contact structure forming an electrically conductive connection with the block along the nail head structure, the nail head structure being in an interface region with the electrically conductive contact structure.

26. The component carrier according to claim 25, comprising at least one of the following features:

wherein the contact structure comprises one of the group consisting of a plated metal structure, and a pin pressed into the vertical hole;

wherein the nail head structure protrudes upwardly and/or downwardly beyond the respective planar portion by a length in a range from 5 μm to 70 μm;

wherein the block comprises a metal coated ceramic, or consists of a metal.

27. A method of manufacturing a component carrier, comprising:

providing a stack comprising at least one electrically conductive layer structure and/or at least one electrically insulating layer structure;

arranging a first electronic component and a second electronic component in the stack;

arranging a first block and a second block in the stack below the first electronic component and the second electronic component; and arranging a third block and a fourth block in the stack above the first electronic component and the second electronic component;

arranging the first electronic component and the second electronic component on and/or within a first core, arranging the first block and the second block on and/or within a second core, arranging the third block and the fourth block on and/or within a third core;

providing a connection medium in an interior of the stack for connecting at least one of the first electronic component and the second electronic component;

wherein the first core is connected with the second and/or third core by a further electrically insulating layer structure, having a through hole aligned with the connection medium, and wherein the blocks are thermally conductive.

* * * * *